(12) United States Patent
Kostecka et al.

(10) Patent No.: US 8,995,136 B2
(45) Date of Patent: Mar. 31, 2015

(54) COMMUNICATIONS BLADED PANEL SYSTEMS

(71) Applicant: ADC Telecommunications, Inc., Berwyn, PA (US)

(72) Inventors: Ryan Kostecka, Chaska, MN (US); Steven J. Brandt, Savage, MN (US)

(73) Assignee: ADC Telecommunications, Inc., Berwyn, PA (US)

( * ) Notice: Subject to any disclaimer, the term of this patent is extended or adjusted under 35 U.S.C. 154(b) by 78 days.

(21) Appl. No.: 13/723,822

(22) Filed: Dec. 21, 2012

(65) Prior Publication Data
US 2013/0163218 A1   Jun. 27, 2013

Related U.S. Application Data

(60) Provisional application No. 61/579,952, filed on Dec. 23, 2011.

(51) Int. Cl.
| | | |
|---|---|---|
| *H05K 5/00* | (2006.01) | |
| *H05K 7/00* | (2006.01) | |
| *G06F 1/16* | (2006.01) | |
| *H05K 7/14* | (2006.01) | |

(52) U.S. Cl.
CPC .................. *H05K 7/14* (2013.01); *H05K 7/005* (2013.01); *H05K 7/1489* (2013.01)
USPC .................. 361/727; 361/679.37; 361/679.39; 361/726

(58) Field of Classification Search
USPC .......... 361/679.37, 679.38, 679.39, 724, 725, 361/726, 727
See application file for complete search history.

(56) References Cited

U.S. PATENT DOCUMENTS

| | | | |
|---|---|---|---|
| 6,910,267 B1 | 6/2005 | Erwin | |
| 7,627,221 B2 | 12/2009 | Morris | |
| 7,876,580 B2* | 1/2011 | Mayer | 361/826 |
| 8,452,148 B2* | 5/2013 | Cooke et al. | 385/135 |
| 2003/0185536 A1 | 10/2003 | Steinman et al. | |
| 2006/0018622 A1* | 1/2006 | Caveney et al. | 385/135 |
| 2006/0109638 A1 | 5/2006 | Lee | |
| 2006/0210229 A1 | 9/2006 | Scadden | |
| 2006/0234782 A1 | 10/2006 | Dorenkamp et al. | |
| 2008/0175552 A1* | 7/2008 | Smrha et al. | 385/135 |
| 2008/0239689 A1 | 10/2008 | Okamoto et al. | |
| 2010/0310225 A1* | 12/2010 | Anderson et al. | 385/135 |
| 2011/0115494 A1 | 5/2011 | Taylor et al. | |
| 2011/0267794 A1* | 11/2011 | Anderson et al. | 361/810 |

FOREIGN PATENT DOCUMENTS

JP    2009-32068    2/2009

OTHER PUBLICATIONS

U.S. Appl. No. 13/025,743, filed Feb. 11, 2011.

(Continued)

*Primary Examiner* — Anthony Haughton
(74) *Attorney, Agent, or Firm* — Merchant & Gould P.C.

(57) ABSTRACT

A fiber panel system includes a chassis and at least blades configured to mount to the chassis. Each blade is moveable relative to the chassis between a retracted (closed) position and at least one extended position. Each blade may be locked into one or more positions relative to the chassis using one or more latching arrangements. Each latching arrangement includes two flexible arms. A stop member is disposed at a distal end of each flexible arm.

22 Claims, 17 Drawing Sheets

(56) References Cited

OTHER PUBLICATIONS

U.S. Appl. No. 13/025,750, filed Feb. 11, 2011.
Non-Final Office Action for U.S. Appl. No. 13/025,743 mailed Feb. 7, 2013.
Response to Non-Final Office Action for U.S. Appl. No. 13/025,743, filed Jul. 8, 2013.
Final Office Action for U.S. Appl. No. 13/025,743 mailed Aug. 2, 2013.
Response to Final Office Action for U.S. Appl. No. 13/025,743, filed Oct. 2, 2013.
Non-Final Office Action for U.S. Appl. No. 13/025,743 mailed Oct. 11, 2013.
Response to Non-Final Office Action for U.S. Appl. No. 13/025,743, filed Jan. 13, 2014.
Final Office Action for U.S. Appl. No. 13/025,743 mailed Feb. 12, 2014.
Response to Final Office Action for U.S. Appl. No. 13/025,743, filed May 12, 2014.
Non-Final Office Action for U.S. Appl. No. 13/025,743 mailed Jun. 13, 2014.

* cited by examiner

COMMUNICATIONS BLADED PANEL SYSTEMS

CROSS-REFERENCE TO RELATED APPLICATIONS

This application claims priority to U.S. Provisional Application No. 61/579,952, filed Dec. 23, 2011, and titled "Communications Bladed Panel Systems," the disclosure of which is hereby incorporated herein by reference.

BACKGROUND

In communications infrastructure installations, a variety of communications devices can be used for switching and connecting communications signal transmission paths in a communications network. Some such communications devices are installed in one or more equipment racks to permit organized, high-density installations to be achieved in limited space available for equipment.

Installing a large number of connections in an equipment rack is efficient with respect to floor space, but places a premium on the ability to manage and maintain the communications cables leading to and away from these equipment racks. Further, due to the increasing demand for communications system capacity, it is desirable to increase the density of connections within a given space that can be achieved.

SUMMARY

The present disclosure relates to communications panels which provide a higher density of connections within a given floor space, provide improved cable management structures, and provide physical layer management capabilities. One or more communications devices for providing such connections can be bundled into compact operational units, known as blades.

One aspect of the present disclosure relates to a communications panel system including one or more blades mounted to a chassis. In some implementations, the blades are configured to move separately relative to the chassis. In certain implementations, the blades are configured to latch into one or more predefined positions.

Aspects of the present disclosure relates to latching arrangements by which the blades secure to one or more of the predefined positions. In accordance with some aspects, the latching arrangements are secured to the blades without tools. In accordance with some aspects, the latching arrangements operate independently of a central handle used to move the blades between the positions.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Figure 1:
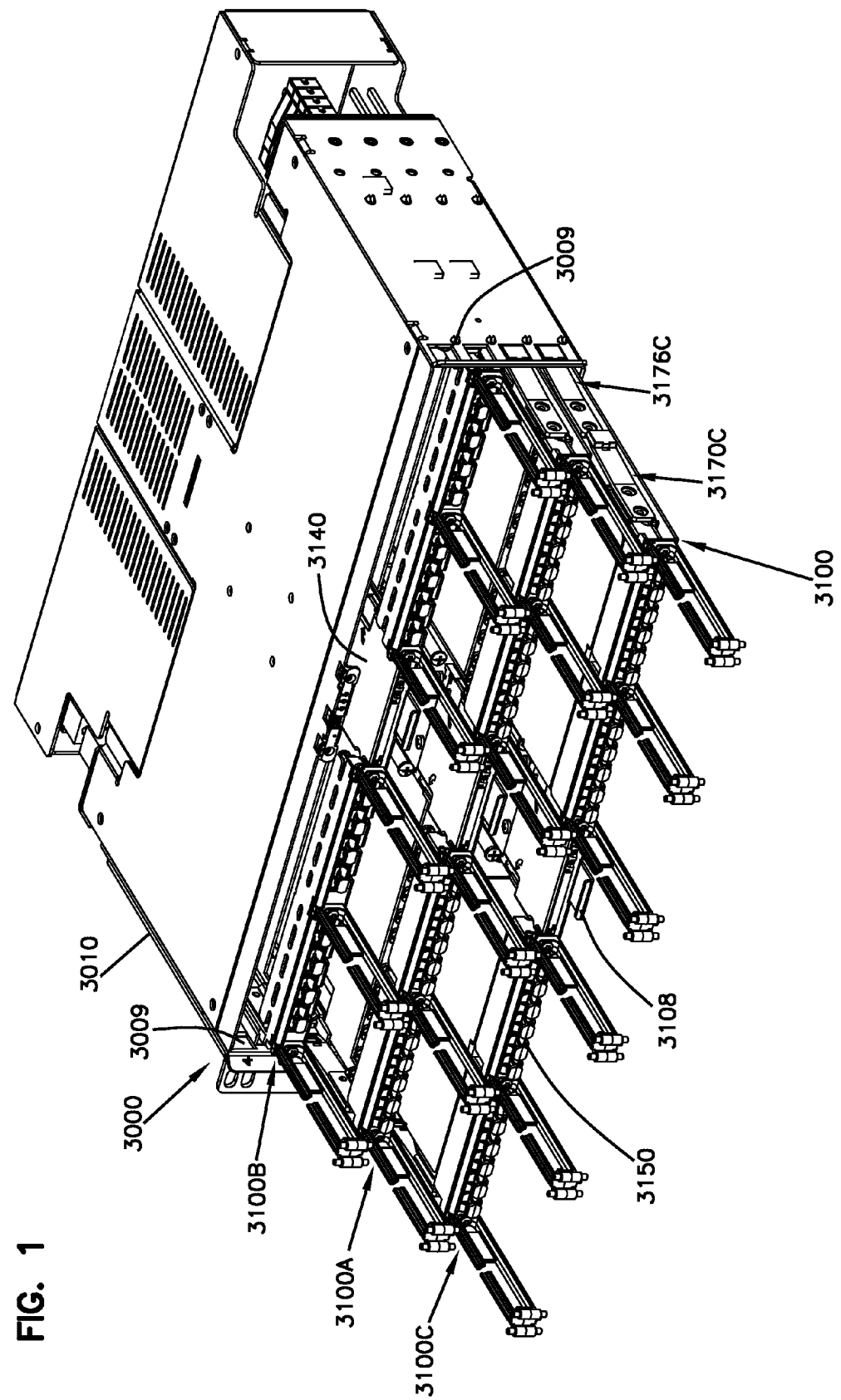
FIG. 1 illustrates one example bladed panel system in which a plurality of blades is mounted within an example chassis with a top blade shown in a closed position relative to the chassis, a middle blade shown in a first extended position relative to the chassis, and a bottom blade shown in a second extended position relative to the chassis.

The present disclosure is directed to bladed distribution panel systems for use in communications networks. The bladed distribution panel systems include one or more bladed distribution modules that are configured to connect together two or more cables. Certain types of bladed distribution modules include one or more first cable ports at which terminated ends of first cables (e.g., patch cables) can be plugged and one or more second cable ports at which terminated ends of second cables (e.g., distribution cables) can be plugged. Opposite ends of the first cables can connect together ports of two or more bladed distribution modules. Opposite ends of the second cables can connect the bladed distribution modules to a larger communications network as will be described in more detail herein. Communications signals pass through the bladed distribution modules between the first cables and the second cables.

In addition, PLI (physical layer information) cables also may be routed to the bladed distribution modules. In accordance with some aspects, the PLI cables may provide power (e.g., electrical power) to the bladed distribution modules. In accordance with other aspects, the PLI cables may carry additional data signals between the bladed distribution modules and a data network as will be described in more detail herein. In certain implementations, the data network is different from the communications network to which the second cables connect.

As the term is used herein, a "cable" refers to a physical medium that is capable of carrying one or more data signals along its length. Non-limiting examples of suitable cables include fiber cables, electrical cables, and hybrid cables. For example, a fiber optic cable includes one or more optical fibers that are configured to carry optical signals along their length. The fibers in a fiber optic cable may be buffered and/or jacketed (e.g., individually or as a group). Certain types of fiber optic cables may be terminated with one or more connectors (e.g., SC, LC, FC, LX.5, or MPO connectors).

An electrical cable includes one or more conductors (e.g., wires) that are configured to carry electrical signals along their length. The conductors in an electrical cable may be insulated (e.g., individually or as a group). Non-limiting examples of electrical cables include CAT-5, 6, and 7 twisted-pair cables, DS1 line, and DS3 line. Certain types of electrical cables may be terminated with one or more connectors or connector assemblies (e.g., RJ jacks and plugs, DSX jacks and plugs, BNC connectors, F connectors, punch-down terminations, or bantam jacks and plugs). A hybrid cable includes a combination of one or more wires and one or more optical fibers that may be insulated/jacketed.

Reference will now be made in detail to exemplary aspects of the present disclosure that are illustrated in the accompanying drawings. Wherever possible, the same reference numbers will be used throughout the drawings to refer to the same or like parts.

FIG. 1 illustrates a first example bladed panel system 3000 suitable for mounting to a communications equipment rack. The first example bladed panel system 3000 includes a chassis 3010 configured to receive one or more communications blades 3100. The bladed panel system 3000 is configured to connect segments of communications media (e.g., connectorized optical fibers, connectorized electrical conductors, etc.) carrying communications signals. For the sake of convenience, media segments routed to the rear of the chassis 3010 will be referred to herein as "incoming" media segments and the media segments routed to the front of the chassis 3010 will be referred to herein as "outgoing" media segments. However, each media segment may carry incoming signals, outgoing signals, or both.

In the example shown in FIG. 1, three types of blade 3100A, 3100B, 3100C are shown disposed in an example chassis 3010. The upper blade 3100B is configured to receive incoming and outgoing media segments terminated with MPO connectors. The middle blade 3100A is configured to receive incoming and outgoing media segments terminated with LC connectors. The lower blade 3100C is configured to receive incoming media segments terminated with MPO connectors and outgoing media segments terminated with LC connectors. Further details on various example types of blades can be found in U.S. Publication No. 2011/0267794 A1, filed Feb. 11, 2011, and titled "Communications Bladed Panel Systems," the disclosure of which is hereby incorporated by reference herein.

In general, each blade 3100 includes a generally planar base having a front, a rear, and opposing sides. A handle 3108 extends from the front of the base to facilitate positioning of the blade 3100 relative to the chassis 3010 as will be described in more detail herein. Each blade 3100 also includes a coupler arrangement 3150. In certain implementations, a frame holds at least a portion of the coupler arrangement 3150 to the blade 3100. In some implementations, the coupler arrangement 3150 defines one or more rear ports at which incoming media segments are received and one or more front ports at which outgoing media segments are received. In some implementations, the front and rear ports are defined by couplers located at the front of the blade 3100. In other implementations, the rear ports are defined by couplers located at the rear of the blade 3100.

In some implementations, each coupler of the coupler arrangement 3150 is an adapter configured to receive and optically couple optical fiber cables. As the term is used herein, optical fiber cables refer to one or more strands of optical fibers. In certain implementations, the optical fibers are jacketed or buffered. In some implementations, the optical fibers of a cable are individually connectorized (e.g., with LC connectors, SC connectors, ST connectors, FC connectors, LX.5 connectors, etc.). In other implementations, multiple optical fibers may be terminated at the same connector (e.g., an MPO connector).

In other implementations, one or more couplers of the coupler arrangement 3150 is configured to electrically connect two or more electrical media segments. For example, the coupler arrangement may include a socket for receiving an electrical connector terminating a conductor cable. The socket may connect to one or more IDCs at which other conductors are terminated. In other implementations, the coupler arrangement may include other types of terminations of electrical conductors. In still other implementations, the coupler arrangement may include media converters that are configured to receive one or more optical fiber and one or more electrical conductors to create a communications pathway therebetween.

In some implementations, the blade 3100 is a smart blade as described in more detail in U.S. Patent Publication No. 2011/0267794 A1, the disclosure of which is incorporated by reference above. The coupler arrangement 3150 of the smart blade 3100 also includes one or more media reading interfaces that are configured to read physical layer information stored on or in the media segments received at the coupler arrangement 3150. Example media reading interfaces are disclosed in U.S. Publication No. 2011/0262077 A1, filed Feb. 11, 2011, and titled "Managed Fiber Connectivity Systems," and U.S. Publication No. 2011/0115494 A1, filed Oct. 19, 2010, and titled "Managed Electrical Connectivity Systems," the disclosures of which are hereby incorporated by reference herein.

In accordance with some aspects, the bladed panel system 3000 is configured to enable the blades 3100 to move relative to the chassis 3010 into one or more locked or otherwise identifiable positions. Moving one of the blades 3100 to a different position relative to the other blades 3100 in the chassis 3010 may aid a user in accessing the coupler ports of the blade 3100 and/or any media segments inserted therein. For example, moving one of the blades 3100 forward of the other blades 3100 may provide space for a user to grasp a connector inserted into one of the coupler ports of the blade 3100. In accordance with certain aspects, moving one of the blades 3100 to a different position also may provide access to the blade processor 3140.

In some implementations, each blade 3100 may move between a closed position and a first extended position. In the closed position, the blade 3100 is positioned within the chassis so that the front ports of the blade 3100 are located at the open front of the chassis 3010 and retention fingers extend forwardly of the chassis 3010. In the first extended position, at least the front ports of the blade 3100 are located forwardly of the open front of the chassis 3010. In certain implementations, the rear ports of the coupler 3150 also are located forwardly of the open front of the chassis 3010 when the blade 3100 is in the first extended position.

In some implementations, the blades 3100 also may move to a second extended position. In the second extended position, the front ports of the blade 3100 are located farther forward of the front chassis opening compared to their location in the first extended position. In some implementations, the blade processor 3140 is accessible when the blade 3100 is in the second extended position. In certain implementations, the blade processor 3140 is accessible when the blade 3100 is in the first extended position. In some implementations, rear ports of the blade 3100 are accessible when the blade 3100 is in the second extended position. In some implementations, a smart blade 3100 remains connected to a back plane of a chassis when in the first extended position and disconnects from the back plane when in the second extended position.

By way of example, in FIG. 1, the upper blade 3100B is in a closed position; the middle blade 3100A is in a first extended position, and the lower blade 3100C is in a second extended position. The front ports of the upper blade 3100B generally align with the open front of the chassis housing 3010. The processor 3140 of the upper blade 3100B is not accessible. The front ports of the middle blade 3100A are spaced forward of the open front of the chassis 3010. The processor 3140 may be accessible from the front of the chassis 3010. The front ports of the lower blade 3100C are spaced farther forward of the open front of the chassis 3010 than the front ports of the middle blade 3100A.

In some implementations, each blade 3100 is configured to travel over a distance ranging from about one inch to about five inches between the closed position and the first extended position. Indeed, in some implementations, each blade 3100 travels over a distance ranging from about two inches to about four inches between the closed position and the first extended position. In one example implementation, each blade 3100 travels about three inches between the closed position and the first extended position. In other implementations, however, each blade 3100 may travel a greater or lesser amount between the closed and first extended positions.

In some implementations, each blade 3100 travels over a distance ranging from about four inches to about eight inches between the closed position and the second extended position. Indeed, in some implementations, each blade 3100 travels over a distance ranging from about five inches to about seven inches between the closed position and the second extended position. In one example implementation, each blade 3100 travels about six inches between the closed position and the second extended position. In some implementations, each blade 3100 travels about three inches between the first and second extended positions. In other implementations, however, each blade 3100 may travel a greater or lesser amount between the first and second extended positions (e.g., one inch, two inches, three inches, four inches, etc.).

Figure 2:
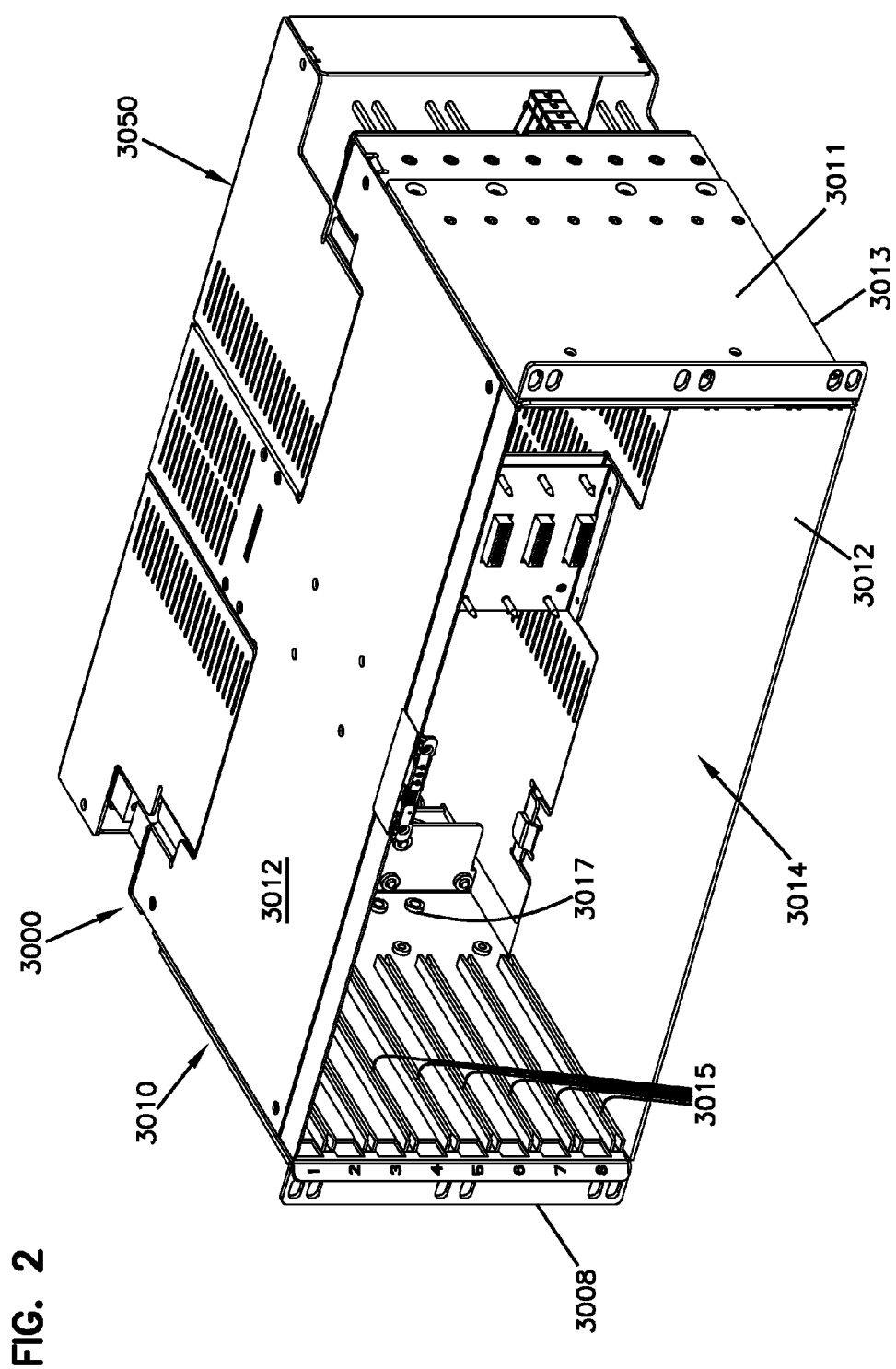
FIG. 2 illustrates an example chassis of a bladed panel system suitable for receiving one or more blades in accordance with aspects of the present disclosure.
Figure 3:
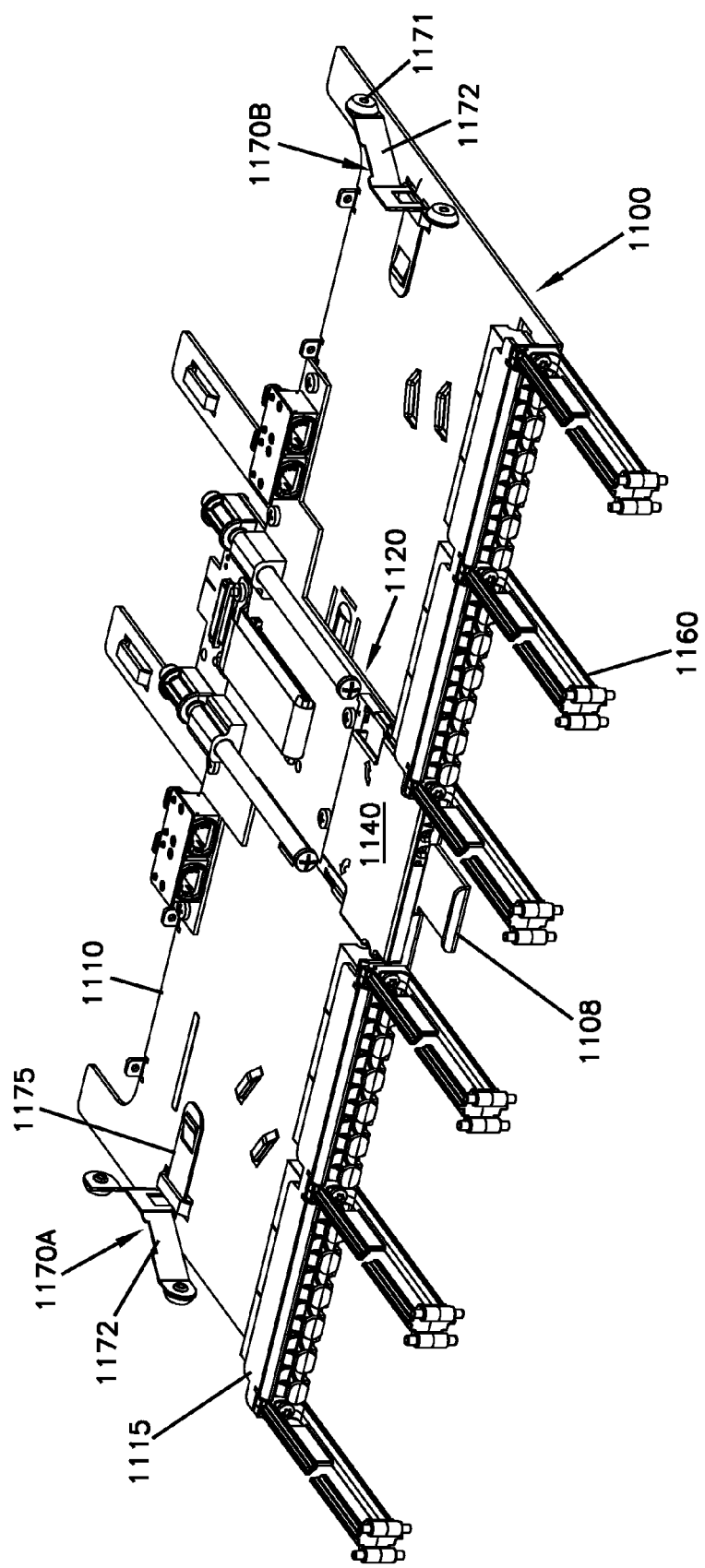
FIG. 3 is a front, top perspective view of an example blade including first and second latching arrangement by which a blade may be secured relative to the chassis in at least one position.
Figure 4:
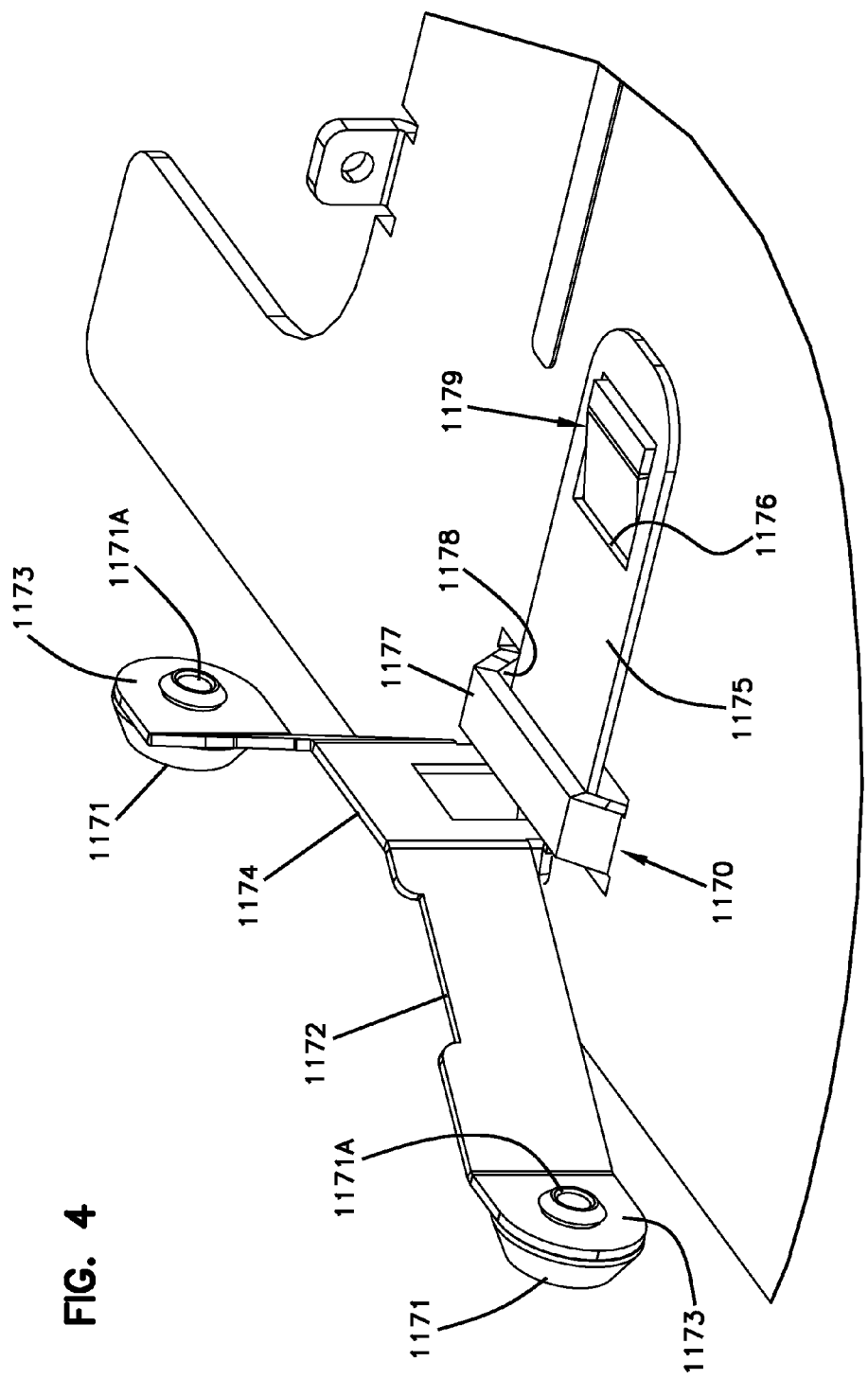
FIG. 4 is an enlarged view of a portion of FIG. 3.
Figure 5:
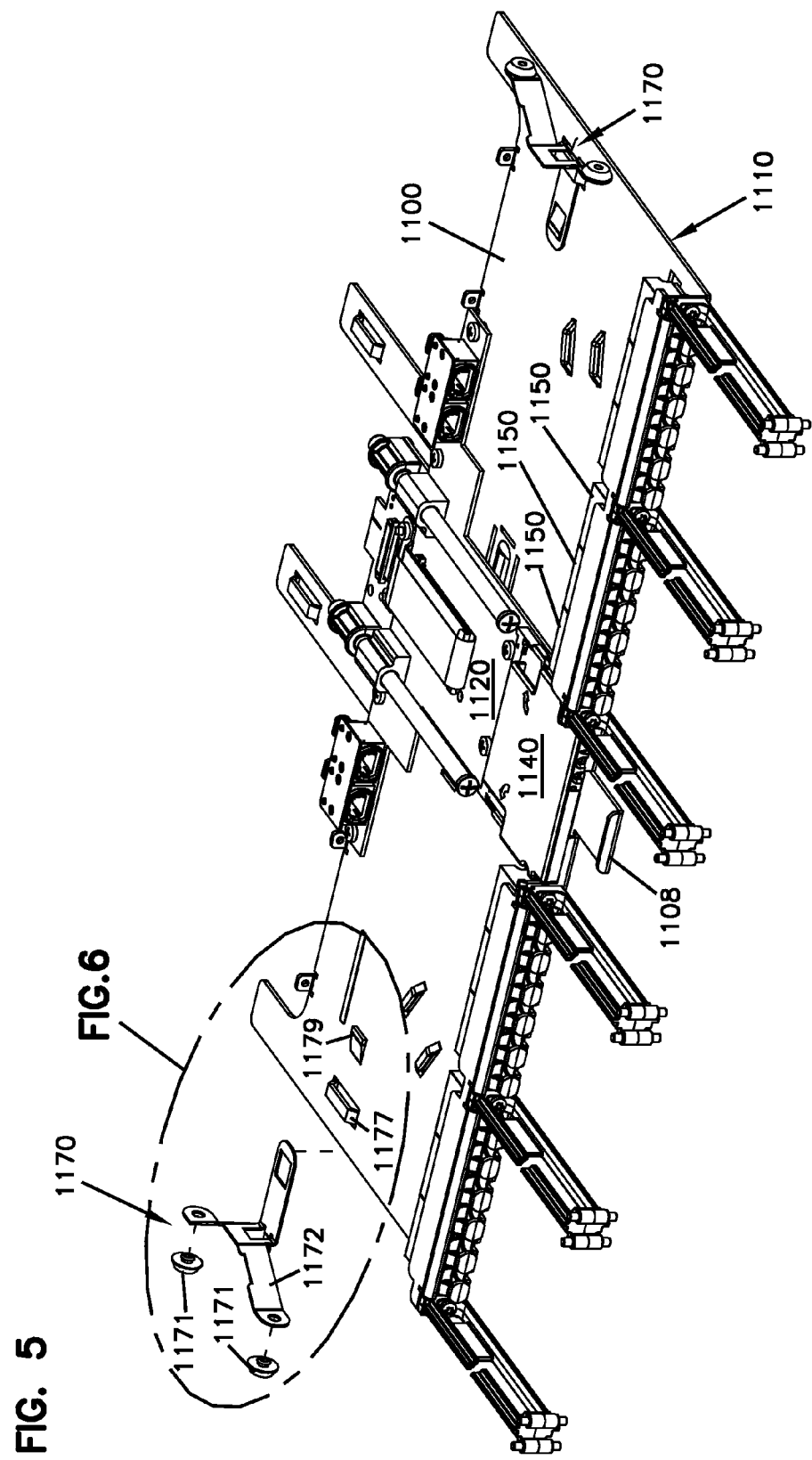
FIG. 5 shows the blade of FIG. 3 with one of the latching arrangements exploded from a base of the blade and with stop members of the latching arrangement exploded from the remainder of the latching arrangement.

FIG. 2 is a front perspective view of an example chassis 3010 suitable for use in the bladed panel system 3000. The example chassis 3010 includes opposing side walls 3011 interconnected by opposing major surfaces 3012 to form a housing 3013 defining an interior 3014. In the example shown, the chassis housing 3013 defines an open front and an open rear. In other implementations, one or both of the front and rear can be at least partially closed. A cover or management enclosure 3050 also can be mounted to the chassis 3010 to organize one or more of the media segments.

Mounting members 3008 are mounted to the opposing side walls 3011 to facilitate mounting the chassis housing 3013 to a communications rack. In accordance with one implementation, the mounting members 3008 are L-shaped flanges having first sections that attach to the side walls 3011 and second sections that extend generally parallel with an open end face of the chassis housing 3013. In other embodiments, however, other types of mounting members 3008 can be used to mount the chassis housing 3013 to a rack. In still other embodiments, other types of mounting equipment can be used (e.g., to mount the chassis housing 3013 to shelves).

Guides 3015 can be provided within the interior 3014 of the chassis housing 3013. The guides 3015 enable the blades 3100 to move relative to the chassis housing 3013. In certain embodiments, each blade 3100 is configured to move separately from the other blades 3100. In certain implementations, the blades 3100 are configured to travel along a connector insertion direction. For example, the blades 3100 may be configured to travel in a forward-rearward direction. In some embodiments, the guides 3015 are implemented as slides that facilitate sliding movement of the blades 3100 along the guides 3015.

Referring to FIGS. 1 and 2, in accordance with some aspects, each blade 3100 may be secured into one or more positions relative to the chassis. In accordance with some aspects, each blade 3100 includes a latching arrangement that is configured to secure the blade 3100 in one or more positions. FIG. 1 illustrates one example latching arrangement by which a blade 3100 may be latched or otherwise secured in the closed position, first extended position, and second extended position. Each blade 3100 with the example latching arrangement includes one or more latching tabs 3170 configured to engage with the chassis housing 3010 to lock the blade 3100 in one of a plurality of positions.

In such implementations, at least one side of the chassis housing 3010 defines one or more latching recesses 3009 or openings that receive the latching tabs 3170. In certain implementations, the blade 3100 may include one or more latching tabs 3170 configured to cooperate with one or more latching openings 3009 defined in the chassis housing 3010. In some implementations, the chassis 3010 defines one latching opening 3009 for each blade 3100 at the front of the chassis 3010. In other implementations, the chassis 3010 defines a latching opening 3009 at the front of each side wall 3011 for each blade 3100 to be received. In still other implementations, each side 3011 of the chassis 3010 may define multiple openings 3009 for each blade 3100.

Figure 6:
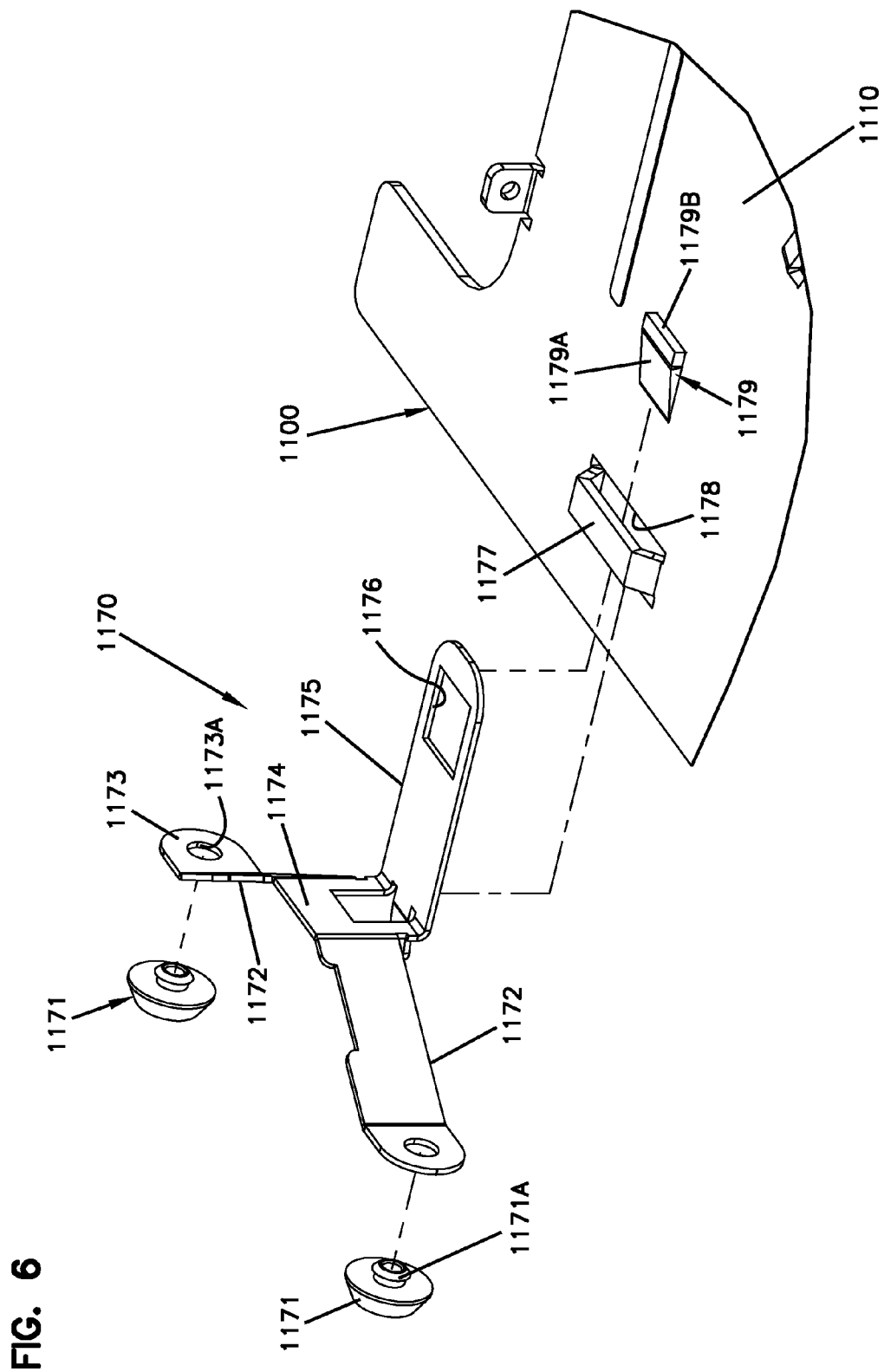
FIG. 6 is an enlarged view of a portion of FIG. 5.
Figure 7:
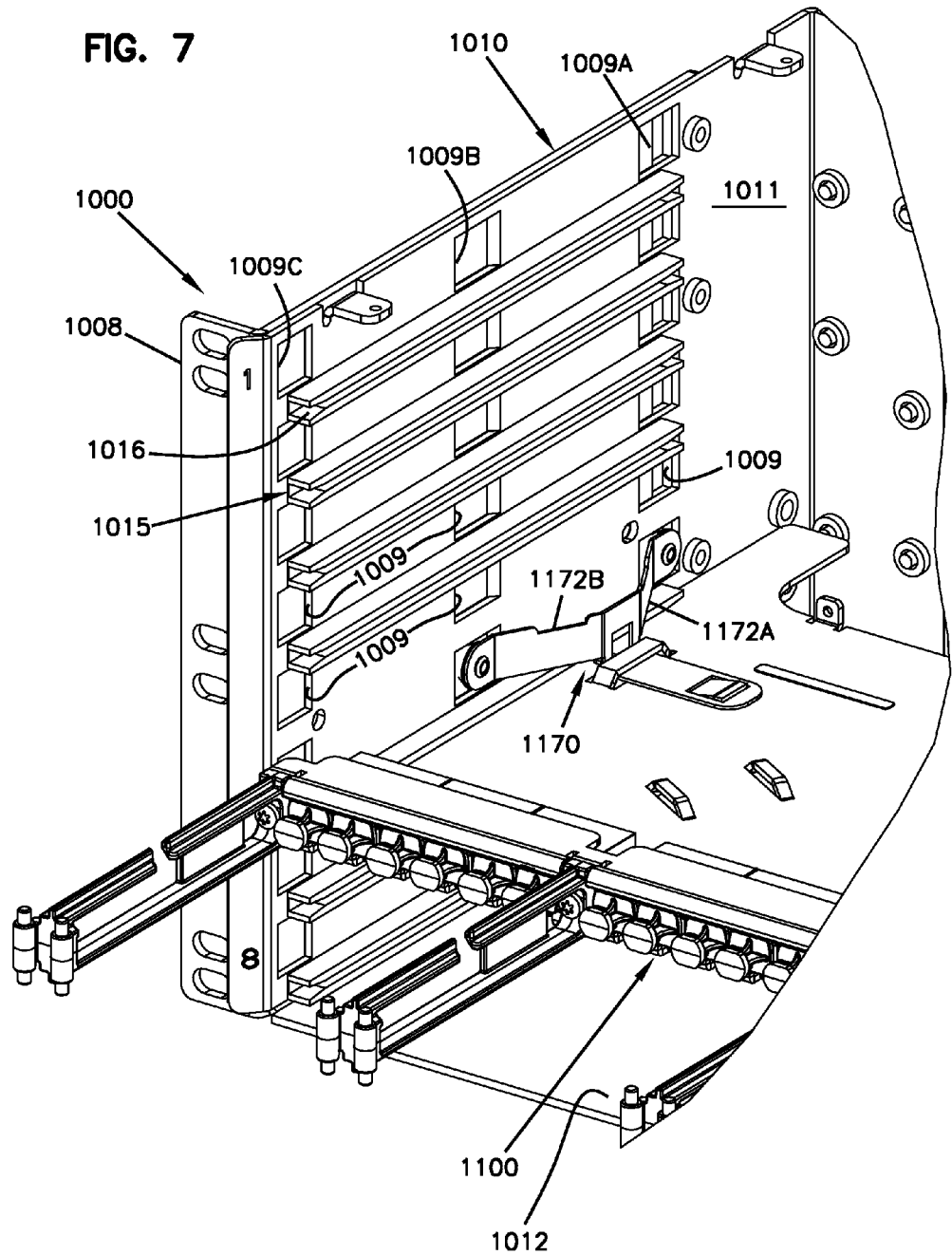
FIG. 7 is a front perspective view of an example bladed panel system including the blade of FIG. 3 disposed in an example chassis in a closed position.
Figure 8:
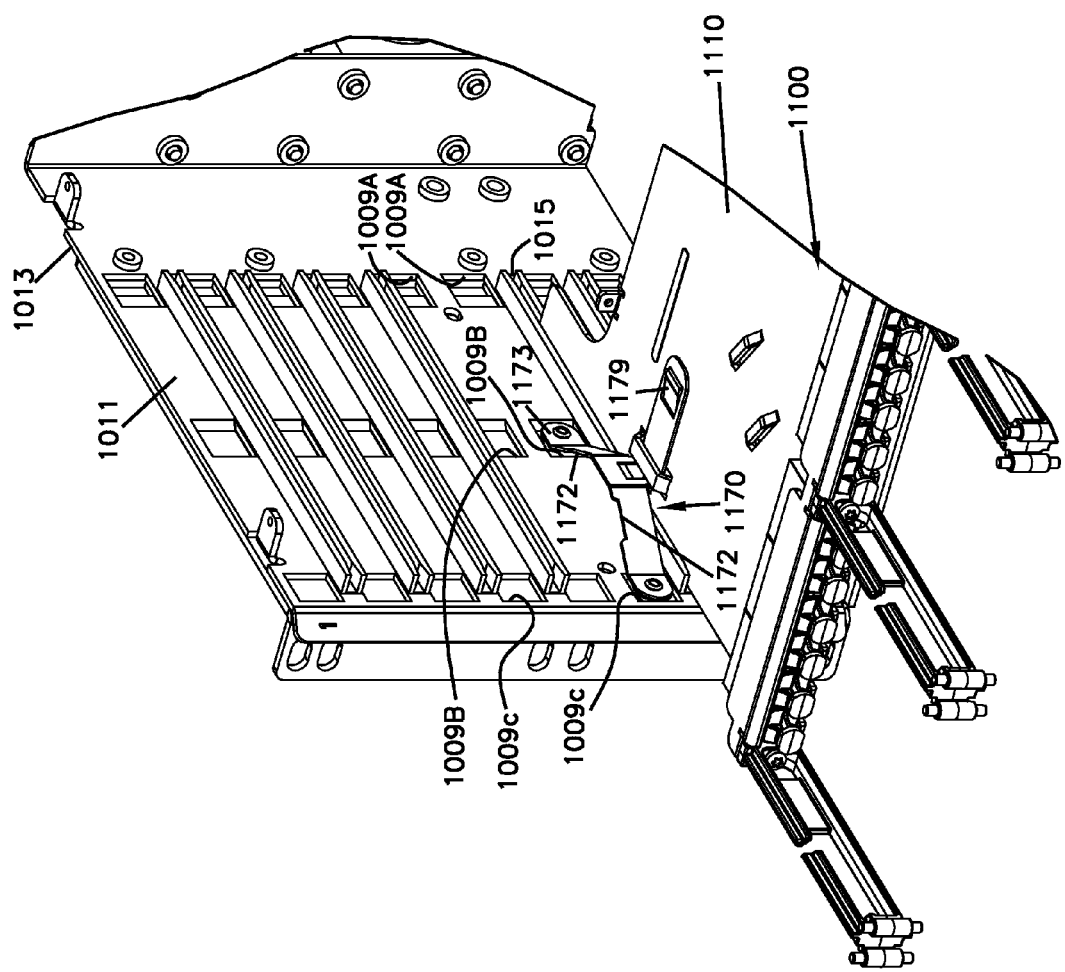
FIG. 8 is a front perspective view of the example bladed panel system of FIG. 7 with the blade disposed in a first extended position.
Figure 9:
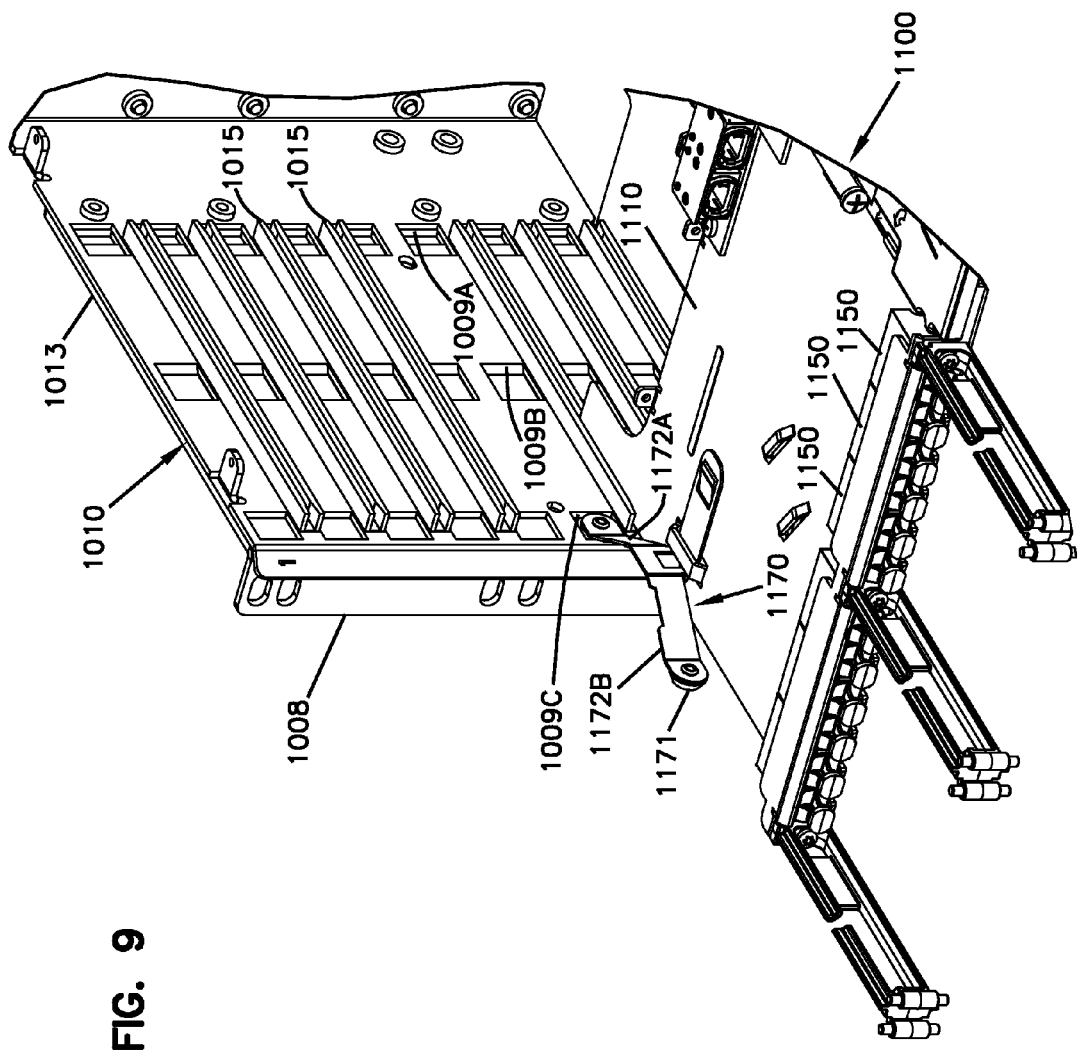
FIG. 9 is a front perspective view of the example bladed panel system of FIG. 7 with the blade disposed in a second extended position.
Figure 10:
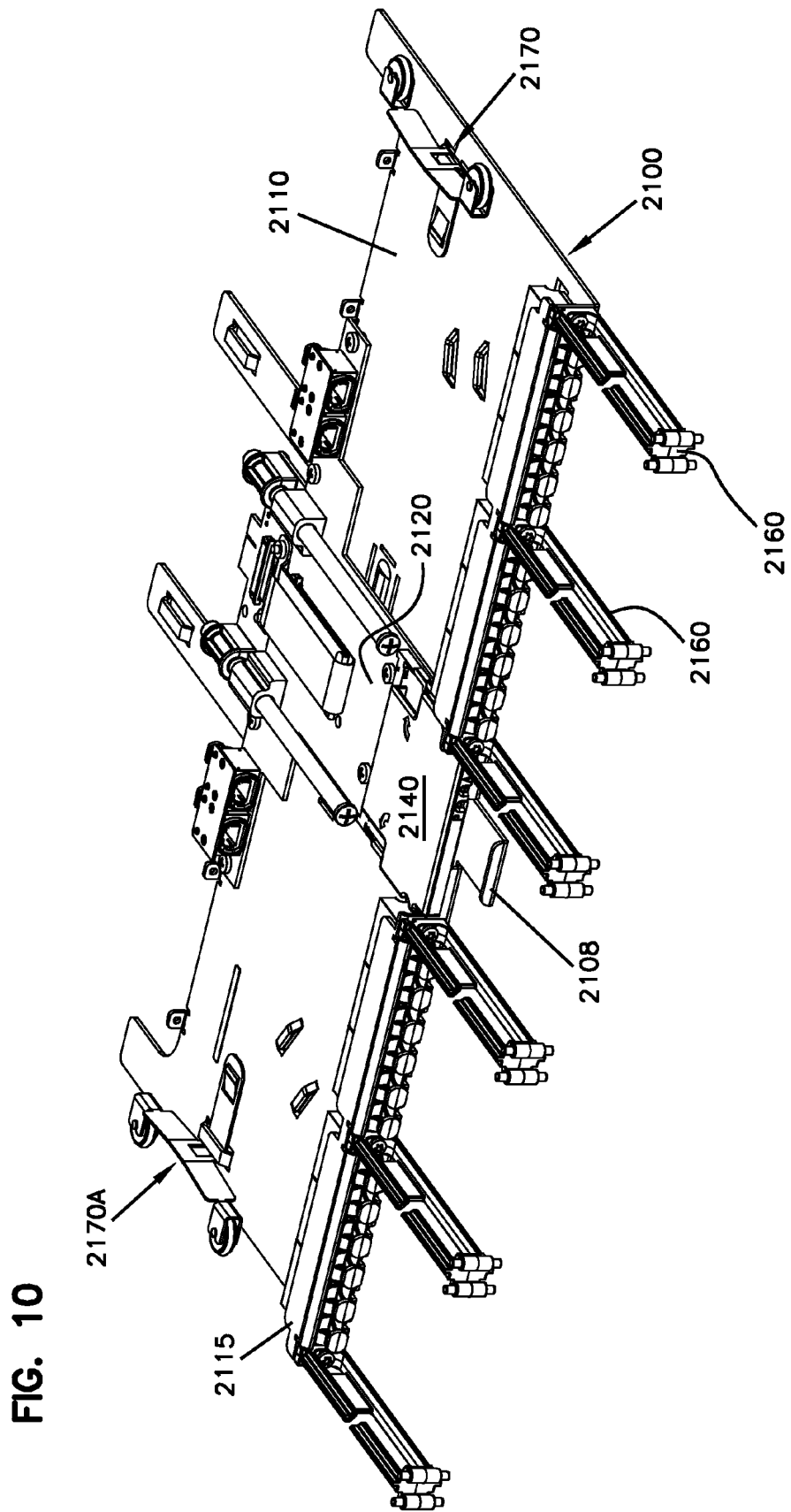
FIG. 10 is a front, top perspective view of another example blade including first and second latching arrangement by which a blade may be secured relative to the chassis in at least one position.
Figure 11:
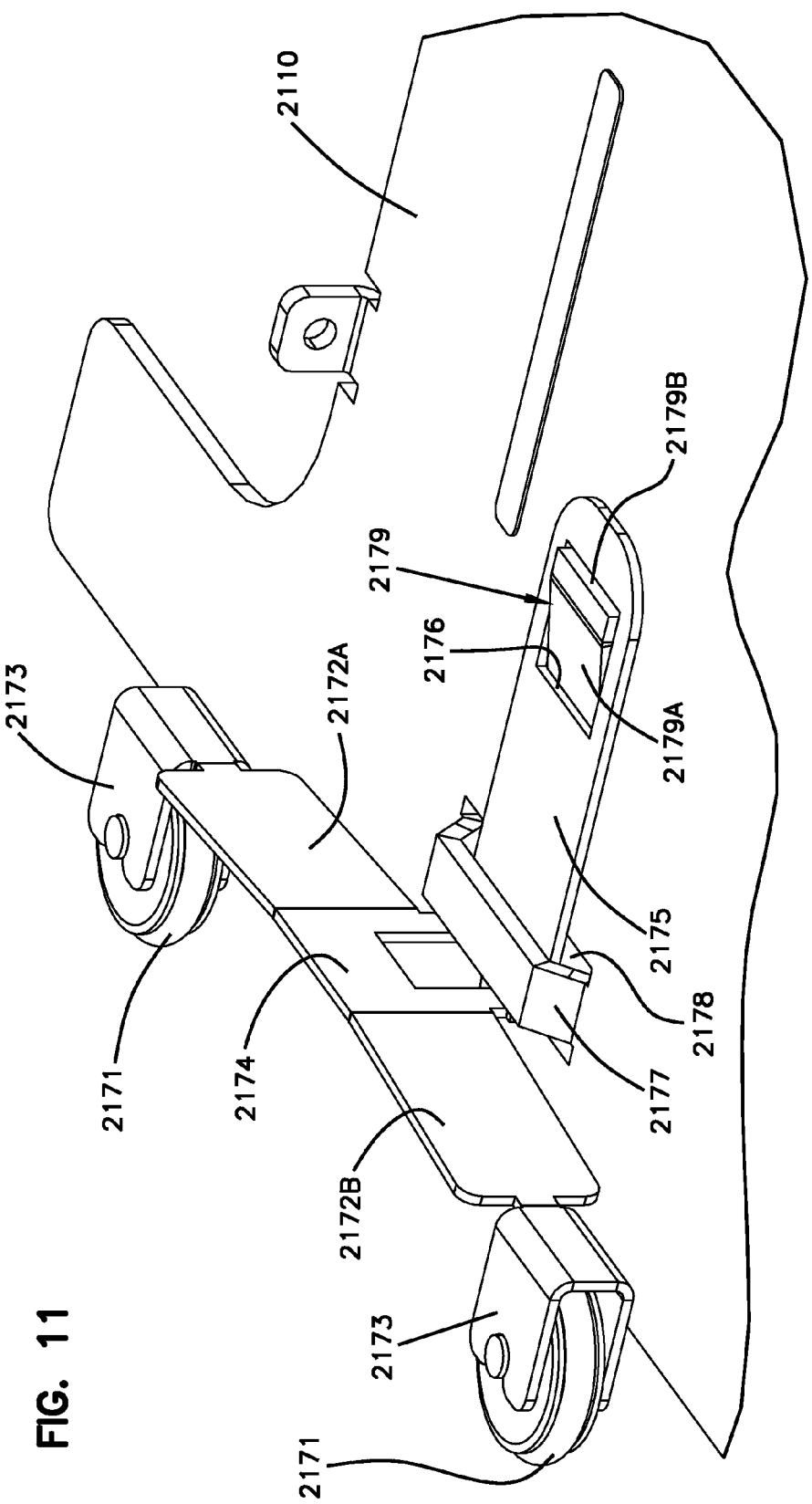
FIG. 11 is an enlarged view of a portion of FIG. 10.
Figure 12:
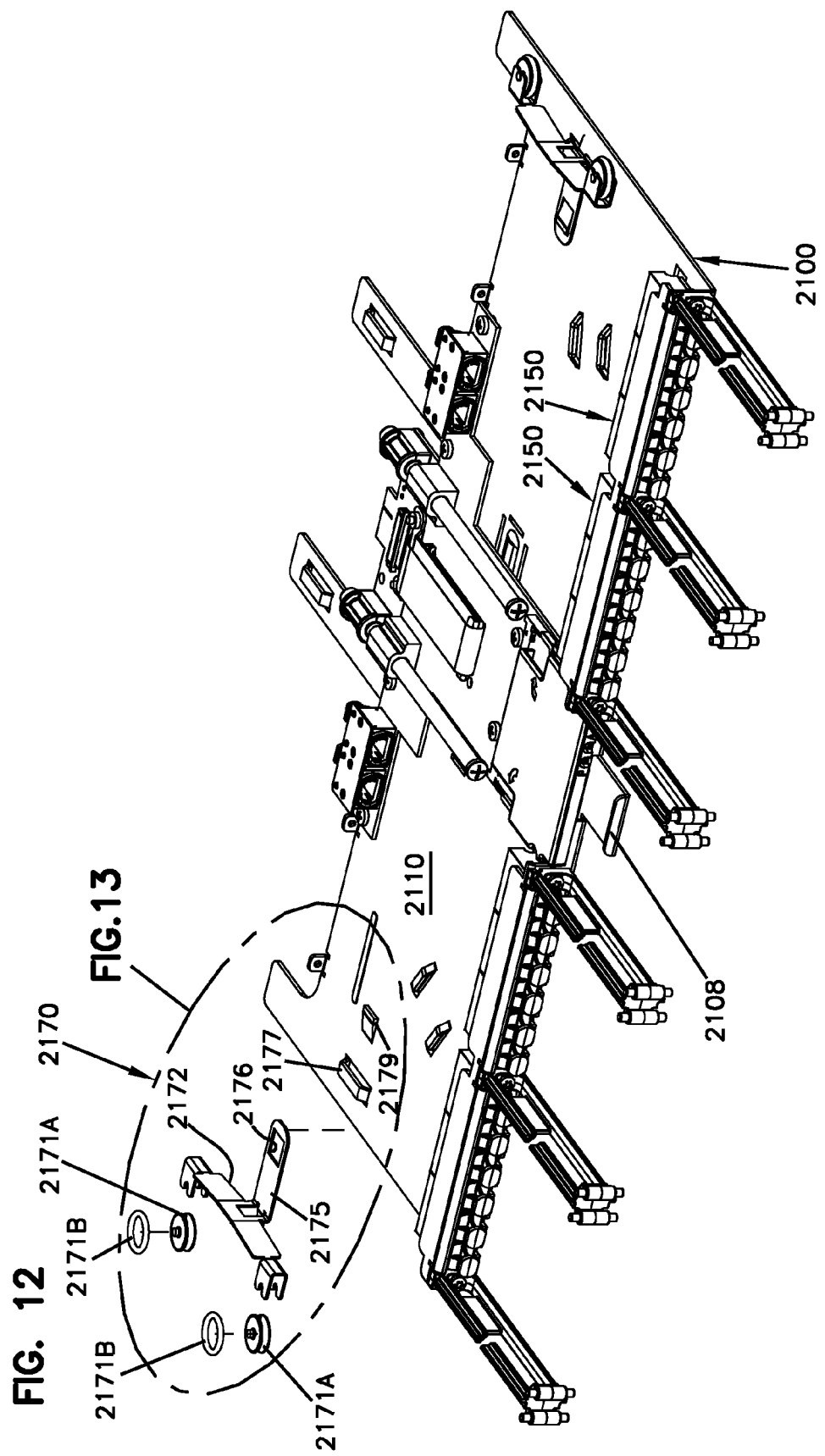
FIG. 12 shows the blade of FIG. 10 with one of the latching arrangements exploded from a base of the blade and with stop members of the latching arrangement exploded from the remainder of the latching arrangement.

FIGS. 3-6 illustrate a second example blade 1100 that is suitable for use with a second example chassis 1010 of FIGS. 7-9 in a panel system in a communications equipment rack. In some implementations, the second example chassis 1010 is substantially the same as the first example chassis 3010 of FIGS. 1 and 2. The second example chassis 1010 is configured to receive one or more communications blades 1100 to connect segments of communications media (e.g., connectorized optical fibers, connectorized electrical conductors, etc.) carrying communications signals. For the sake of convenience, media segments routed to the rear of the second chassis 1010 will be referred to herein as "incoming" media segments and the media segments routed to the front of the second chassis 1010 will be referred to herein as "outgoing" media segments. However, each media segment may carry incoming signals, outgoing signals, or both.

In general, each blade 1100 includes a generally planar base 1110 having a front, a rear, and opposing sides. A handle 1108 extends from the front of the base 1110 to facilitate positioning of the blade 1100 relative to the chassis 1010 as will be described in more detail herein. Each blade 1100 also includes a coupler arrangement 1150. In certain implementations, a frame 1115 holds at least a portion of the coupler arrangement 1150 to the blade 1100. In some implementations, the coupler arrangement 1150 defines one or more rear ports at which incoming media segments are received and one or more front ports at which outgoing media segments are received. In some implementations, the front and rear ports are defined by couplers located at the front of the blade 1100. In other implementations, the rear ports are defined by couplers located at the rear of the blade 1100.

In some implementations, each coupler of the coupler arrangement 1150 is an adapter configured to receive and optically couple optical fiber cables. As the term is used herein, optical fiber cables refer to one or more strands of optical fibers. In certain implementations, the optical fibers are jacketed or buffered. In some implementations, the optical fibers of a cable are individually connectorized (e.g., with LC connectors, SC connectors, ST connectors, FC connectors, LX.5 connectors, etc.). In other implementations, multiple optical fibers may be terminated at the same connector (e.g., an MPO connector).

For example, in certain implementations, the blade 1100 is configured to receive incoming and outgoing media segments terminated with MPO connectors. In certain implementations, the blade 1100 is configured to receive incoming and outgoing media segments terminated with LC connectors. In certain implementations, the blade 1100 is configured to receive incoming media segments terminated with MPO connectors and outgoing media segments terminated with LC connectors. Further details on various example types of blades can be found in U.S. application Ser. No. 13/025,750, the disclosure of which is incorporated by reference above.

In other implementations, one or more couplers of the coupler arrangement 1150 are configured to electrically connect two or more electrical media segments. For example, the coupler arrangement may include a socket for receiving an electrical connector terminating a conductor cable. The socket may connect to one or more IDCs at which other conductors are terminated. In other implementations, the coupler arrangement may include other types of terminations of electrical conductors. In still other implementations, the coupler arrangement may include media converters that are configured to receive one or more optical fiber and one or more electrical conductors to create a communications pathway therebetween.

In some implementations, the blade 1100 is a smart blade as described in more detail in U.S. patent application Ser. No. 13/025,750, the disclosure of which is incorporated by reference above. The coupler arrangement 1150 of the smart blade 1100 also includes one or more media reading interfaces that are configured to read physical layer information stored on or in the media segments received at the coupler arrangement 1150. Example media reading interfaces are disclosed in U.S. application Ser. Nos. 13/025,841 and 12/907,724, the disclosures of which are incorporated by reference above.

FIGS. 7-9 illustrate a portion of a second example chassis 1010 that includes opposing side walls 1011 interconnected by opposing major surfaces 1012 to form a housing 1013 defining an interior. In the example shown, the chassis housing 1013 defines an open front and an open rear. In other implementations, one or both of the front and rear can be at least partially closed. A cover or management enclosure also can be mounted to the chassis 1010 to organize one or more of the media segments.

Mounting members 1008 are mounted to the opposing side walls 1011 to facilitate mounting the chassis housing 1013 to a communications rack. In accordance with one implementation, the mounting members 1008 are L-shaped flanges having first sections that attach to the side walls 1011 and second sections that extend generally parallel with an open end face of the chassis housing 1013. In other embodiments, however, other types of mounting members 1008 can be used to mount the chassis housing 1013 to a rack. In still other embodiments, other types of mounting equipment can be used (e.g., to mount the chassis housing 1013 to shelves).

Guides 1015 are provided within the interior of the chassis housing 1013. The guides 1015 enable the blades 1100 to move relative to the chassis housing 1013. In the example shown, the housing is configured to receive eight guides 1015, and hence eight blades 1100, within the housing 1013. In other implementations, however, the chassis housing 1013 may be configured to receive any desired number of blades 1100. In certain embodiments, each blade 1100 is configured to move separately from the other blades 1100. In certain implementations, the blades 1100 are configured to travel along a connector insertion direction. For example, the blades 1100 may be configured to travel in a forward-rearward direction. In some embodiments, the guides 1015 define longitudinal slots that facilitate sliding movement of the blades 1100 along the guides 1015.

In accordance with some aspects, the bladed panel system 1000 is configured to enable each of the blades 1100 to move relative to the chassis 1010 into one or more locked or otherwise identifiable positions. Moving one of the blades 1100 to a different position relative to the other blades 1100 in the chassis 1010 may aid a user in accessing the coupler ports of the blade 1100 and/or any media segments inserted therein. For example, moving one of the blades 1100 forward of the other blades 1100 may provide space for a user to grasp a connector inserted into one of the coupler ports of the blade 1100. In accordance with certain aspects, moving one of the blades 1100 to a different position also may provide access to the blade processor 1140.

In some implementations, each blade 1100 may move between a closed position and a first extended position. In the closed position, the blade 1100 is positioned within the chassis so that the front ports of the blade 1100 are located at the open front of the chassis 1010 and retention fingers 1160 extend forwardly of the chassis 1010. In the first extended position, at least the front ports of the blade 1100 are located forwardly of the open front of the chassis 1010. In certain implementations, the rear ports of the coupler 1150 also are located forwardly of the open front of the chassis 1010 when the blade 1100 is in the first extended position.

In some implementations, the blades 1100 also may move to a second extended position. In the second extended position, the front ports of the blade 1100 are located farther forward of the front chassis opening compared to their location in the first extended position. In some implementations, the blade processor 1140 is accessible when the blade 1100 is in the second extended position. In certain implementations, the blade processor 1140 is accessible when the blade 1100 is in the first extended position.

By way of example, the second example blade 1100 is shown in a closed position in FIG. 7; the second example blade 1100 is shown in a first extended position in FIG. 8; and the second example blade 1100 is shown in a second extended position in FIG. 9. The front ports of the blade 1100 generally align with the open front of the chassis housing 1010 and the processor 1140 is not accessible when the blade 1100 is in the closed position. The front ports of the blade 1100 are spaced forward of the open front of the chassis 1010 and the processor 1140 may be accessible from the front of the chassis 1010 when the blade 1100 is in the first extended position. The front ports of the blade 1100 are spaced farther forward of the open front of the chassis 1010 when the blade 1100 is in the second extended position than when the blade 1100 is in the first extended position.

In some implementations, each blade 1100 is configured to travel over a distance ranging from about one inch to about five inches between the closed position and the first extended position. Indeed, in some implementations, each blade 1100 travels over a distance ranging from about two inches to about four inches between the closed position and the first extended position. In one example implementation, each blade 1100 travels about three inches between the closed position and the first extended position. In other implementations, however, each blade 1100 may travel a greater or lesser amount between the closed and first extended positions.

In some implementations, each blade 1100 travels over a distance ranging from about four inches to about eight inches between the closed position and the second extended position. Indeed, in some implementations, each blade 1100 travels over a distance ranging from about five inches to about seven inches between the closed position and the second extended position. In one example implementation, each blade 1100 travels about six inches between the closed position and the second extended position. In some implementations, each blade 1100 travels about three inches between the first and second extended positions. In other implementations, however, each blade 1100 may travel a greater or lesser amount between the first and second extended positions (e.g., one inch, two inches, three inches, four inches, etc.).

Referring to FIGS. 3-6, in accordance with some aspects, each blade 1100 may be secured into one or more positions relative to the chassis 1010. In accordance with some aspects, each blade 1100 includes a latching arrangement 1170 that is configured to secure the blade 1100 to the chassis 1010 in one of a plurality of positions. In some implementations, each blade 1100 includes two latching arrangements 1170. For example, the blade 1100 of FIG. 3 includes a first latching arrangement 1170A at a first side of the base 1110 and a second latching arrangement 1170B at a second side of the base 1110. In other implementations, the blade 1100 may include a greater number of latching arrangements 1170.

Each latching arrangement 1170 includes at least one stop member 1171 (e.g., bump, lug, or other detents) that is configured to fit in one or more latching recesses 1009 defined in the chassis housing 1010. In the example shown, each latching arrangement 1170 includes two stop members 1171. In other implementations, however, each latching arrangement 1170 may include a greater or lesser number of stop members 1171. In the example shown, each stop member 1171 defines a frustro-conical (i.e., a truncated cone) shape with the reduced circumference portion of the stop member 1171 facing laterally outwardly from the blade 1100. In other implementations, however, the stop member 1171 may have any desired shape (e.g., domed, squared, cylindrical, etc.).

Each stop member 1171 of the latching arrangement 1170 is disposed on a tab 1173 that is coupled to a flexible arm 1172. For example, each stop member 1171 may include an attachment portion 1171A that snaps into an aperture 1173A defined in the tab 1173 or otherwise secures the stop member 1171 to the tab 1173. In some implementations, the tab 1173 is integral with the arm 1172. In other implementations, the tab 1173 is fastened or otherwise connected to the arm 1172. Each flexible arm 1172 is configured to flex or pivot. In some implementations, each flexible arm 1172 is spring-biased outwardly from the blade 1100.

In some implementations, each latching arrangement 1170 includes two flexible arms 1172 extending outwardly from an intermediate portion 1174. In the example shown, a distal end of a first flexible arm 1172A extends generally rearwardly from the intermediate portion 1174 and a distal end of a second flexible arm 1172 extends generally forwardly of the intermediate portion 1174 (see FIG. 7). The proximal end of each flexible arm 1172 flexibly couples to the intermediate portion 1174 (e.g., via a spring-biased section). The distal ends of the flexible arms 1172 also extend towards one of the sidewalls 1011 of the chassis housing 1013. A tab 1173 is disposed at the distal end of each flexible arm 1172. A stop member 1171 is disposed at each tab 1173.

In some implementations, at least one side of the chassis housing 1010 defines one or more latching recesses or openings 1009 that are sized and shaped to receive the latching stop members 1171 of the latching arrangement 1170. In some implementations, the chassis 1010 defines one latching opening 1009 for each blade 1100 at the front of the chassis 1010. In other implementations, the chassis 1010 defines a latching opening 1009 at the front of each side wall 1011 for each blade 1100 to be received. In still other implementations, each side 1011 of the chassis 1010 may define multiple openings 1009 for each blade 1100.

For example, each sidewall 1011 of the chassis 1010 of FIGS. 7-9 defines a first latching recess 1009A, a second latching recess 1009B, and a third latching opening 1009C for each blade 1100 to be received in the chassis 1010. The latching recesses or opening 1009 for each blade 1100 are spaced longitudinally along the guides 1015. In the example shown, the first latching recess 1009A is disposed at a rear end of the guide 1015 and the third latching opening 1009C is disposed at a front end of the guide 1015. The second latching recess 1009B is disposed at an intermediate portion of the guide 1015. The flexible arms 1172 of the latching arrangement 1170 are sized so that the space between the stop members 1171 is about equal to the space between adjacent latching recesses or openings 1009.

In some implementations, the flexible arms 1172 are resiliently biased into the recesses or openings 1009 defined in the sidewall 1011. For example, in certain implementations the flexible arms 1172 may include spring arms. Accordingly, the stop members 1171 friction fit into the recesses or openings 1009 as the stop members 1171 are slid past the recesses or openings 1009 (i.e., when the blade 1100 is moved relative to the chassis 1010). The flexible arms 1172 allow the stop members 1171 to be refracted from the recess or opening 1009 through application of a tangential force (i.e., forward or rearward movement of the blade 1100 relative to the chassis) that overcomes the biasing force.

In general, the biasing force applied by the flexible arms 1172 is sufficiently strong as to alert a user that a predetermined position of the blade 1100 relative to the chassis 1010 has been reached. For example, the biasing force is sufficiently strong that a user must noticeably increase the amount of force applied to the blade 1100 to move the blade 1100 relative to the chassis 1010. However, the biasing force is sufficiently weak as to allow the user to overcome the biasing force through a tangential application of force instead of a direct application of force to the stop members 1171 or latching arms 1172.

When the blade 1100 is in the closed position, the stop member 1171 of the first flexible arm 1172A is disposed in a corresponding first recess 1009A and the stop member 1171 of the second flexible arm 1172B is disposed in a corresponding second recess 1009B as shown in FIG. 7. When the blade 1100 is moved to the first extended position (e.g., by a user pulling on the handle 1108), the stop members 1171 are pressed against the edges of the sidewall 1011 bounding the respective recesses or openings 1009. When the user applies a sufficient amount of force to overcome the biasing force of the arms 1172, the stop members retract from the recesses or holes 1009 and slide along the interior of the sidewall 1011. When the blade 1100 reaches the first extended position, the stop member 1171 of the first flexible arm 1172A is disposed in the second recess 1009B and the stop member 1171 of the second flexible arm 1172B is disposed in a corresponding third opening 1009C as shown in FIG. 8.

When the blade 1100 is moved to the second extended position from the first extended position (e.g., by a user pulling on the handle 1108), the stop members 1171 are pressed against the edges of the sidewall 1011 bounding the respective recesses or openings 1009. When the user applies a sufficient amount of force to overcome the biasing force of the arms 1172, the force causes the stop members 1171 to flex inwardly against the biasing force, thereby allowing the stop members 1171 to slide (i.e., cam) out of the recesses or holes 1009. The blade 1100 slides along the interior of the sidewall 1011 towards the second position. When the blade 1100 reaches the second extended position, the stop member 1171 of the first flexible arm 1172A snaps into the third opening 1009C as shown in FIG. 9. The second flexible arm 1172B extends through the open front of the chassis housing 1013 and forwardly of the chassis housing 1013.

In some implementations, the opening 1009C extends completely through the sidewall 1011 whereas recesses 1009A and 1009B define depressions in the sidewall 1011. In such implementations, the stop members 1171 may extend further into the openings 1009C than they do into recesses 1009A, 1009B. Accordingly, in certain implementations, a greater force must be applied to retract (i.e., through camming movement) a stop member 1171 from of the opening 1009C than to retract a stop member 1171 from the recesses 1009A, 1009B.

Referring back to FIGS. 3-6, each latching arrangement 1170 includes a mounting flange 1175 that is configured to secure the latching arrangement 1170 to the blade 1100. In some implementations, the base 1110 of the blade 1100 includes a securement flange 1177 that extends upwardly from the base 1110 to define a passage 1178. The securement flange 1177 is sized to accommodate the mounting flange 1175 of one of the latching arrangements 1170 within the passage 1178. For example, the mounting flange 1175 may be slid through the passage 1178. The securement flange 1177 extends over the mounting flange 1175 and, thereby, inhibits the removal of the latching arrangement 1170 from the blade 1100 in an upward direction.

In some implementations, the mounting flange 1175 extends orthogonally to the intermediate portion 1174 of the latching arrangement 1170. In certain implementations, the intermediate portion 1174 of the latching arrangement 1170 limits the distance the mounting flange 1175 may extend through the passage 1178 by abutting the securement flange 1177. Accordingly, the securement flange 1177 also inhibits the removal of the latching arrangement 1170 from the blade 1100 in a first lateral direction.

In some implementations, the base 1110 also includes a latching member 1179 that defines a ramp 1179A and a shoulder 1179B (FIG. 6). The mounting flange 1175 define a mounting aperture 1176 that is sized to receive a sufficient portion of the latching member 1179 to enable an inner edge of the mounting flange 1175 to abut the shoulder 1179B of the latching member 1179. The interaction of the mounting flange 1175 and the latching member 1179 inhibits the removal of the mounting flange 1175 from the base 1110 in a second lateral direction that is opposite the first lateral direction.

In some implementations, the latching arrangement 1170 is coupled to the blade 1100 by latching the mounting flange 1175 to the base 1110 of the blade 1100. For example, a distal end of the mounting flange 1175 may be inserted through the passage 1178 defined by the securement flange 1177 in the first lateral direction. As the mounting flange 1175 is further inserted through the passage 1178, the distal end of the mounting flange 1175 cams over the ramp 1179A of the latching member 1179 and snaps over the shoulder 1179B. The latching connection between the latching arrangement 1170 and the base 1110 allows the latching arrangement 1170 to be mounted to the blade 1100 without tools (e.g., screw driver, riveter, sonic welder, etc.) or fasteners (e.g., screws, rivets, etc.).

FIGS. 10-13 illustrate a third example blade 2100 that is suitable for use with a chassis (e.g., chassis 1010 of FIGS. 7-9) in a panel system in a communications equipment rack. In general, each blade 2100 includes a generally planar base 2110 having a front, a rear, and opposing sides. A handle 2108 extends from the front of the base 2110 to facilitate positioning of the blade 2100 relative to the chassis 1010 as will be described in more detail herein. For example, a user may pull or push the handle 2108 to move the blade 2100 forwardly or rearwardly, respectively.

Each blade 2100 also includes a coupler arrangement 2150. In certain implementations, a frame 2115 holds at least a portion of the coupler arrangement 2150 to the blade 2100. In some implementations, the coupler arrangement 2150 defines one or more rear ports at which incoming media segments are received and one or more front ports at which outgoing media segments are received. In some implementations, the front and rear ports are defined by couplers located at the front of the blade 2100. In other implementations, the rear ports are defined by couplers located at the rear of the blade 2100.

In some implementations, each coupler of the coupler arrangement 2150 is an adapter configured to receive and optically couple optical fiber cables. As the term is used herein, optical fiber cables refer to one or more strands of optical fibers. In certain implementations, the optical fibers are jacketed or buffered. In some implementations, the optical fibers of a cable are individually connectorized (e.g., with LC connectors, SC connectors, ST connectors, FC connectors, LX.5 connectors, etc.). In other implementations, multiple optical fibers may be terminated at the same connector (e.g., an MPO connector).

For example, in certain implementations, the blade 2100 is configured to receive incoming and outgoing media segments terminated with MPO connectors. In certain implementations, the blade 1100 is configured to receive incoming and outgoing media segments terminated with LC connectors. In certain implementations, the blade 2100 is configured to receive incoming media segments terminated with MPO connectors and outgoing media segments terminated with LC connectors. Further details on various example types of blades can be found in U.S. application Ser. No. 13/025,750, the disclosure of which is incorporated by reference above.

In other implementations, one or more couplers of the coupler arrangement 2150 are configured to electrically connect two or more electrical media segments. For example, the coupler arrangement may include a socket for receiving an electrical connector terminating a conductor cable. The socket may connect to one or more IDCs at which other conductors are terminated. In other implementations, the coupler arrangement may include other types of terminations of electrical conductors. In still other implementations, the coupler arrangement may include media converters that are configured to receive one or more optical fiber and one or more electrical conductors to create a communications pathway therebetween.

In some implementations, the blade 2100 is a smart blade as described in more detail in U.S. patent application Ser. No. 13/025,750, the disclosure of which is incorporated by reference above. The coupler arrangement 2150 of the smart blade 2100 also includes one or more media reading interfaces that are configured to read physical layer information stored on or in the media segments received at the coupler arrangement 1150. Example media reading interfaces are disclosed in U.S. application Ser. Nos. 13/025,841 and 12/907,724, the disclosures of which are incorporated by reference above.

In accordance with some aspects, each of the blades 2100 is configured to move relative to the chassis (e.g., chassis 1010) into one or more locked or otherwise identifiable positions. Moving one of the blades 2100 to a different position relative to the other blades 2100 in the chassis 1010 may aid a user in accessing the coupler ports of the blade 2100 and/or any media segments inserted therein. For example, moving one of the blades 2100 forward of the other blades 2100 may provide space for a user to grasp a connector inserted into one of the coupler ports of the blade 2100. In accordance with certain aspects, moving one of the blades 2100 to a different position also may provide access to the blade processor 2140.

In some implementations, each blade 2100 may move between a closed position and a first extended position. In the closed position, the blade 2100 is positioned within the chassis so that the front ports of the blade 2100 are located at the open front of the chassis 1010 and retention fingers 2160 extend forwardly of the chassis 1010. In the first extended position, at least the front ports of the blade 2100 are located forwardly of the open front of the chassis 1010. In certain implementations, the rear ports of the coupler 2150 also are located forwardly of the open front of the chassis 1010 when the blade 2100 is in the first extended position.

In some implementations, the blades 2100 also may move to a second extended position. In the second extended position, the front ports of the blade 2100 are located farther forward of the front chassis opening compared to their location in the first extended position. In some implementations, the blade processor 2140 is accessible when the blade 2100 is in the second extended position. In certain implementations, the blade processor 2140 is accessible when the blade 2100 is in the first extended position.

The front ports of the blade 2100 generally align with the open front of the chassis housing 1010 and the processor 2140 is not accessible when the blade 2100 is in the closed position. The front ports of the blade 2100 are spaced forward of the open front of the chassis 1010 and the processor 2140 may be accessible from the front of the chassis 1010 when the blade 2100 is in the first extended position. The front ports of the blade 2100 are spaced farther forward of the open front of the chassis 1010 when the blade 2100 is in the second extended position than when the blade 2100 is in the first extended position.

In some implementations, each blade 2100 is configured to travel over a distance ranging from about one inch to about five inches between the closed position and the first extended position. Indeed, in some implementations, each blade 2100 travels over a distance ranging from about two inches to about four inches between the closed position and the first extended position. In one example implementation, each blade 2100 travels about three inches between the closed position and the first extended position. In other implementations, however, each blade 2100 may travel a greater or lesser amount between the closed and first extended positions.

In some implementations, each blade 2100 travels over a distance ranging from about four inches to about eight inches between the closed position and the second extended position. Indeed, in some implementations, each blade 2100 travels over a distance ranging from about five inches to about seven inches between the closed position and the second extended position. In one example implementation, each blade 2100 travels about six inches between the closed position and the second extended position. In some implementations, each blade 2100 travels about three inches between the first and second extended positions. In other implementations, however, each blade 2100 may travel a greater or lesser amount between the first and second extended positions (e.g., one inch, two inches, three inches, four inches, etc.).

In accordance with some aspects, each blade 2100 includes a latching arrangement 2170 that is configured to secure the blade 2100 to the chassis 1010 in one of a plurality of positions. In some implementations, each blade 2100 includes two latching arrangements 2170. For example, the blade 2100 of FIG. 10 includes a first latching arrangement 2170A at a first side of the base 2110 and a second latching arrangement 2170B at a second side of the base 2110. In other implementations, the blade 2100 may include a greater number of latching arrangements 2170.

Each latching arrangement 2170 includes at least one stop member 2171 that is configured to fit in one or more latching recesses 1009 defined in the chassis housing 1010. In the example shown, each latching arrangement 1170 includes two stop members 1171. In other implementations, however, each latching arrangement 1170 may include a greater or lesser number of stop members 1171. In the example shown, each stop member 1171 includes a wheel or disc 1171A. In certain implementations, an O-ring or gasket 1171B may be disposed over the wheel 1171A (see FIGS. 11 and 13). Each stop member 1171 of the latching arrangement 1170 is coupled to a yoke 2173 that is coupled to a flexible arm 2172. For example, each wheel 2171A may be rotatably coupled to the yoke 2173 to form a caster wheel arrangement (e.g., a rigid caster wheel). In some implementations, the yoke 2173 is integral with the flexible arm 2172. In other implementations, the yoke 2173 is fastened or otherwise connected to the arm 2172.

In some implementations, each latching arrangement 2170 includes two flexible arms 2172 extending outwardly from an intermediate portion 2174. In certain implementations, the flexible arms 2172 flexibly couple to the intermediate portion 2174 (e.g., via a spring-biased section). In the example shown, a distal end of a first flexible arm 2172A extends generally rearwardly of the intermediate portion 2174 and a distal end of a second flexible arm 2172 extends generally forwardly of the intermediate portion 2174 (see FIG. 11). The distal ends of the flexible arms 2172 also extend towards one of the sidewalls 1011 of the chassis housing 1013. A yoke 2173 is disposed at the distal end of each flexible arm 2172A. A stop member 2171 is disposed at each yoke 2173. The flexible arms 2172 of the latching arrangement 2170 are sized so that the space between the stop members 2171 is about equal to the space between adjacent latching recesses or openings 1009.

As described above, at least one side of the chassis housing 1010 defines one or more latching recesses or openings 1009. The recesses or openings 1009 are sized and shaped to receive the latching stop members 2171 of the latching arrangement 2170. In some implementations, the chassis 1010 defines one latching opening 1009 for each blade 2100 at the front of the chassis 1010. In other implementations, the chassis 1010 defines a latching opening 1009 at the front of each side wall 1011 for each blade 2100 to be received. In still other implementations, each side 1011 of the chassis 1010 may define multiple openings 1009 for each blade 2100.

In some implementations, the flexible arms 2172 are resiliently biased into the recesses or openings 1009 defined in the sidewall 1011. For example, in certain implementations the flexible arms 2172 may include spring arms. Accordingly, the stop members 2171 friction fit into the recesses or openings 1009 as the stop members 2171 are slid or rolled past the recesses or openings 1009 (i.e., when the blade 2100 is moved relative to the chassis 1010). The flexible arms 2172 allow the stop members 2171 to be retracted from the recess or opening 1009 through application of a tangential force (i.e., forward or rearward movement of the blade 2100 relative to the chassis) that overcomes the biasing force.

In general, the biasing force applied by the flexible arms 2172 is sufficiently strong as to alert a user that a predetermined position of the blade 1100 relative to the chassis 1010 has been reached. For example, the biasing force is sufficiently strong that a user must noticeably increase the amount of force applied to the blade 2100 to move the blade 2100 relative to the chassis 1010. However, the biasing force is sufficiently weak as to allow the user to overcome the biasing force through a tangential application of force instead of a direct application of force to the stop members 2171 or latching arms 2172.

When the blade 2100 is in the closed position, the stop member 2171 of the first flexible arm 2172A will be disposed in a corresponding first recess 1009A and the stop member 1171 of the second flexible arm 1172B will be disposed in a corresponding second recess 1009B. When the blade 2100 is moved to the first extended position (e.g., by a user pulling on the handle 2108), the stop members 2171 are pressed against the edges of the sidewall 1011 bounding the respective recesses or openings 1009. When the user applies a sufficient amount of force to overcome the biasing force of the arms 2172, the stop members 2171 retract from the recesses or holes 1009 and roll or slide along the interior of the sidewall 1011. When the blade 2100 reaches the first extended position, the stop member 2171 of the first flexible arm 2172A will snap into the second recess 1009B and the stop member 2171 of the second flexible arm 2172B will snap into a corresponding third opening.

When the blade 2100 is moved to the second extended position from the first extended position (e.g., by a user pulling on the handle 2108), the stop members 2171 are pressed against the edges of the sidewall 1011 bounding the respective recesses or openings 1009. When the user applies a sufficient amount of force to overcome the biasing force of the arms 2172, the stop members 2171 retract from the recesses or holes 1009 and roll or slide along the interior of the sidewall 1011. When the blade 2100 reaches the second extended position, the stop member 2171 of the first flexible arm 2172A will snap into the third opening 1009C. The second flexible arm 2172 will extends through the open front of the chassis housing 1013 and forwardly of the chassis housing 1013.

In some implementations, the opening 1009C extends completely through the sidewall 1011 whereas recesses 1009A and 1009B define depressions in the sidewall 1011. In such implementations, the stop members 2171 may extend further into the openings 1009C than they do into recesses 1009A, 1009B. Accordingly, in certain implementations, a greater force must be applied to retract a stop member 2171 from the opening 1009C than to retract a stop member 2171 from the recesses 1009A, 1009B.

In accordance with some aspects, each latching arrangement 2170 includes a mounting flange 2175 that is configured to secure the latching arrangement 2170 to the blade 2100. In some implementations, the base 2110 of the blade 2100 includes a securement flange 2177 that extends upwardly from the base 2110 to define a passage 2178. The securement flange 2177 is sized to accommodate the mounting flange 2175 of one of the latching arrangements 2170 within the passage 2178. For example, the mounting flange 2175 may be slid through the passage 2178. The securement flange 2177 extends over the mounting flange 2175 and, thereby, inhibits the removal of the latching arrangement 2170 from the blade 2100 in an upward direction.

In some implementations, the mounting flange 2175 extends orthogonally to the intermediate portion 2174 of the latching arrangement 2170. In certain implementations, the intermediate portion 2174 of the latching arrangement 2170 limits the distance the mounting flange 2175 may extend through the passage 2178 by abutting the securement flange 2177. Accordingly, the securement flange 2177 also inhibits the removal of the latching arrangement 2170 from the blade 2100 in a first lateral direction.

Figure 13:
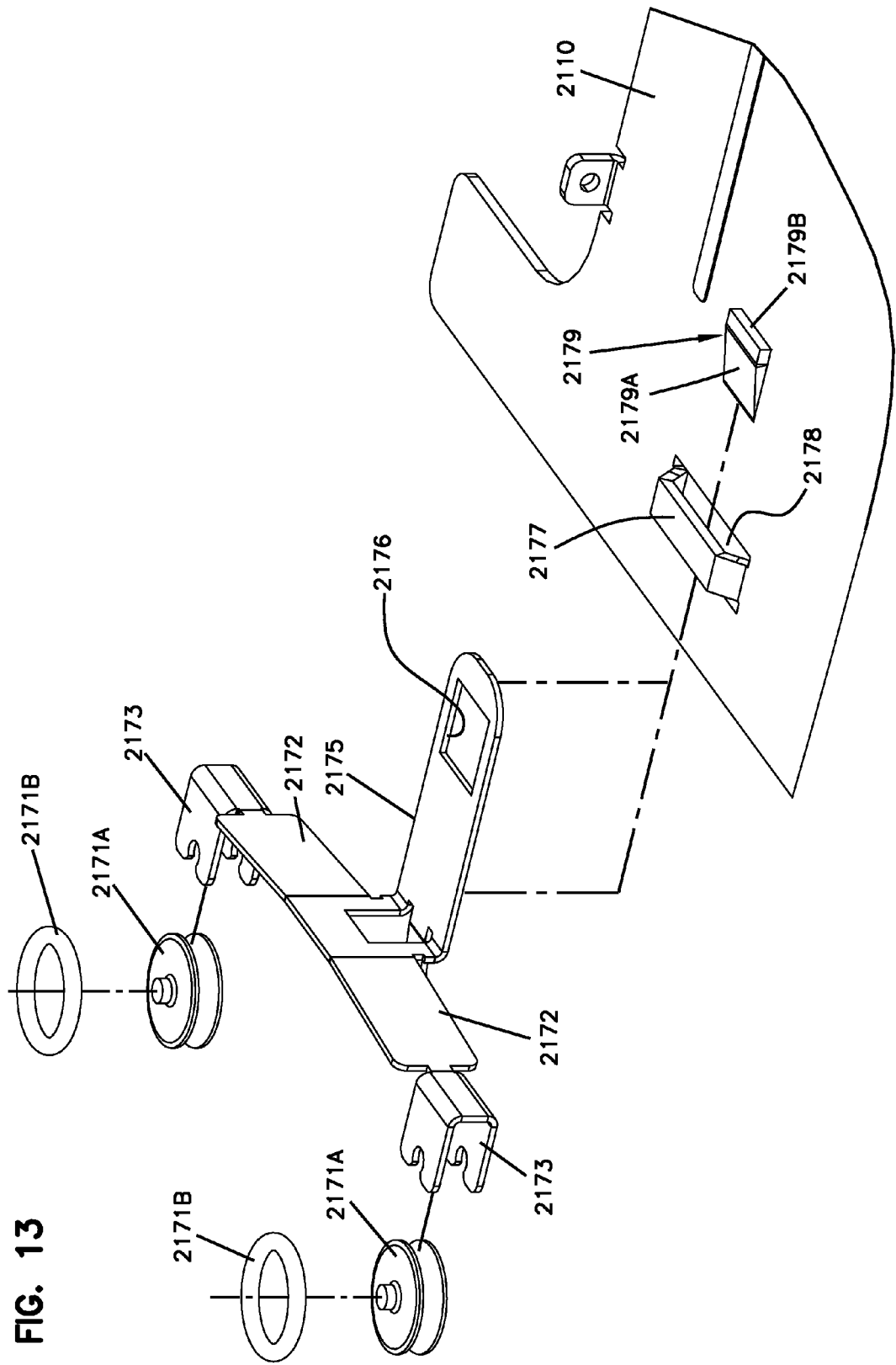
FIG. 13 is an enlarged view of a portion of FIG. 12.

In some implementations, the base 2110 also includes a latching member 2179 that defines a ramp 2179A and a shoulder 2179B (FIG. 13). The mounting flange 2175 define a mounting aperture 2176 that is sized to receive a sufficient portion of the latching member 2179 to enable an inner edge of the mounting flange 2175 to abut the shoulder 2179B of the latching member 2179. The interaction of the mounting flange 2175 and the latching member 2179 inhibits the removal of the mounting flange 2175 from the base 2110 in a second lateral direction that is opposite the first lateral direction.

In some implementations, the latching arrangement 2170 is coupled to the blade 2100 by latching the mounting flange 2175 to the base 1110 of the blade 2100. For example, a distal end of the mounting flange 2175 may be inserted through the passage 2178 defined by the securement flange 2177 in the first lateral direction. As the mounting flange 2175 is further inserted through the passage 2178, the distal end of the mounting flange 2175 cams over the ramp 2179A of the latching member 2179 and snaps over the shoulder 2179B. The latching connection between the latching arrangement 2170 and the base 2110 allows the latching arrangement 2170 to be mounted to the blade 2100 without tools (e.g., screw driver, riveter, sonic welder, etc.) or fasteners (e.g., screws, rivets, etc.).

Figure 14:
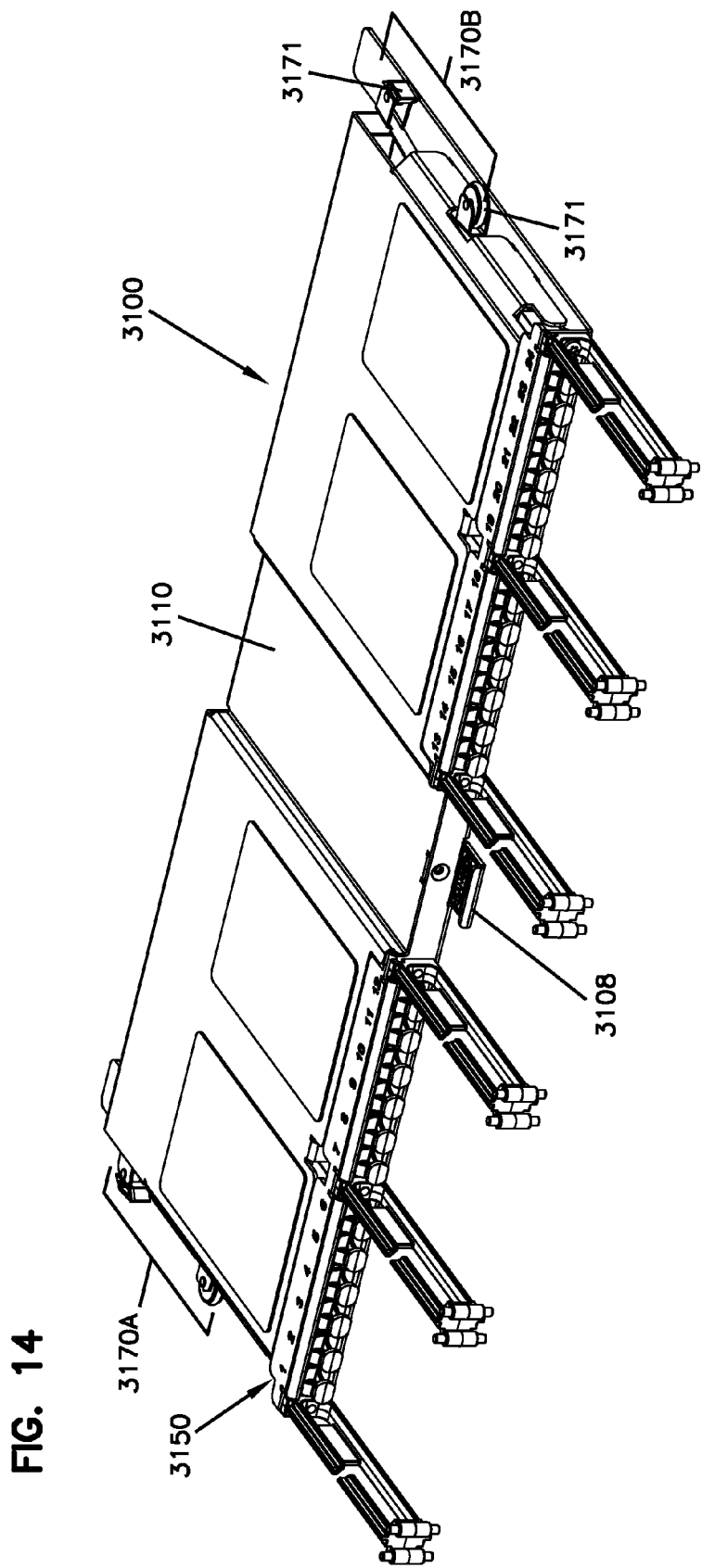
FIG. 14 is a front, top perspective view of another example blade including first and second latching arrangement by which a blade may be secured relative to the chassis in at least one position.
Figure 15:
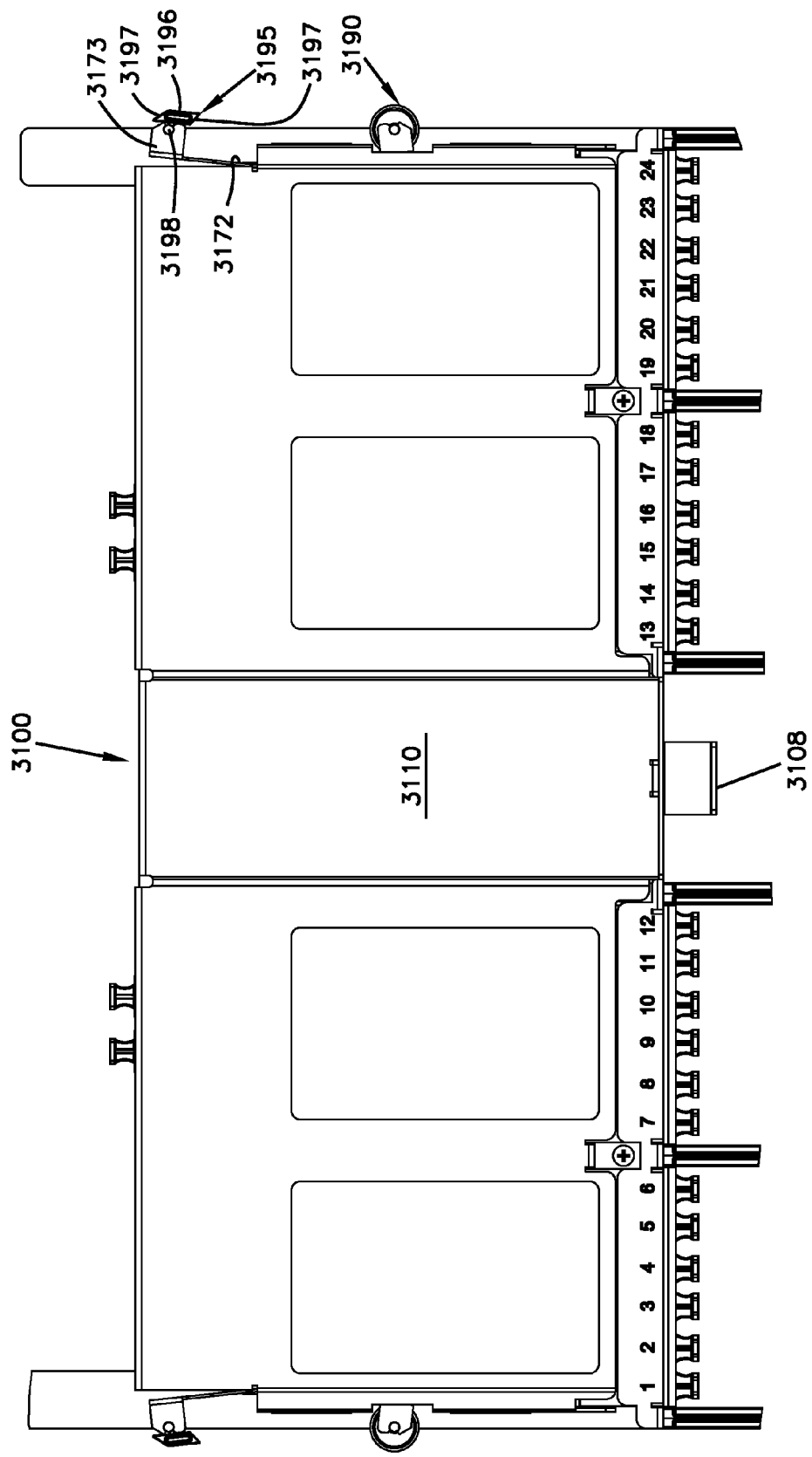
FIG. 15 is a top plan view of the blade of FIG. 14.
Figure 16:
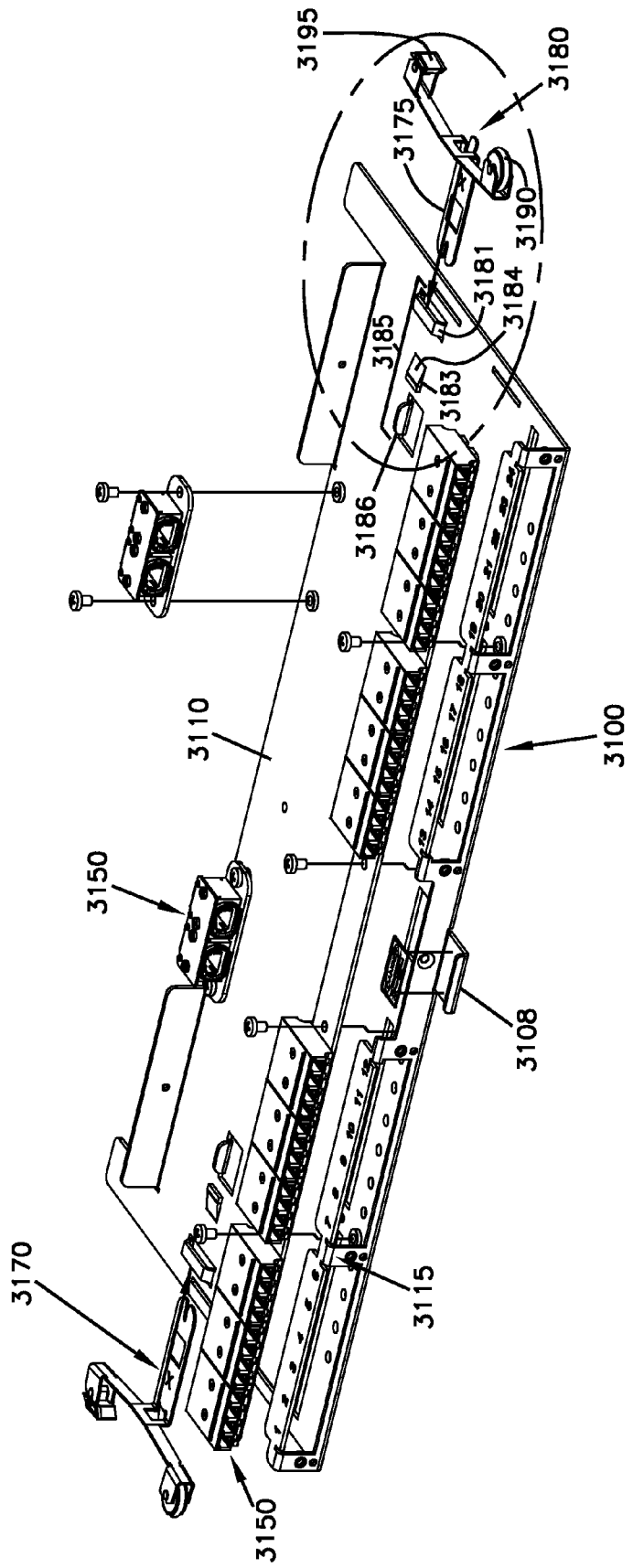
FIG. 16 is a front, top perspective view of a base of the blade of FIG. 14 with housing portions removed and components, including portions of the latching arrangements, exploded from the base.
Figure 17:
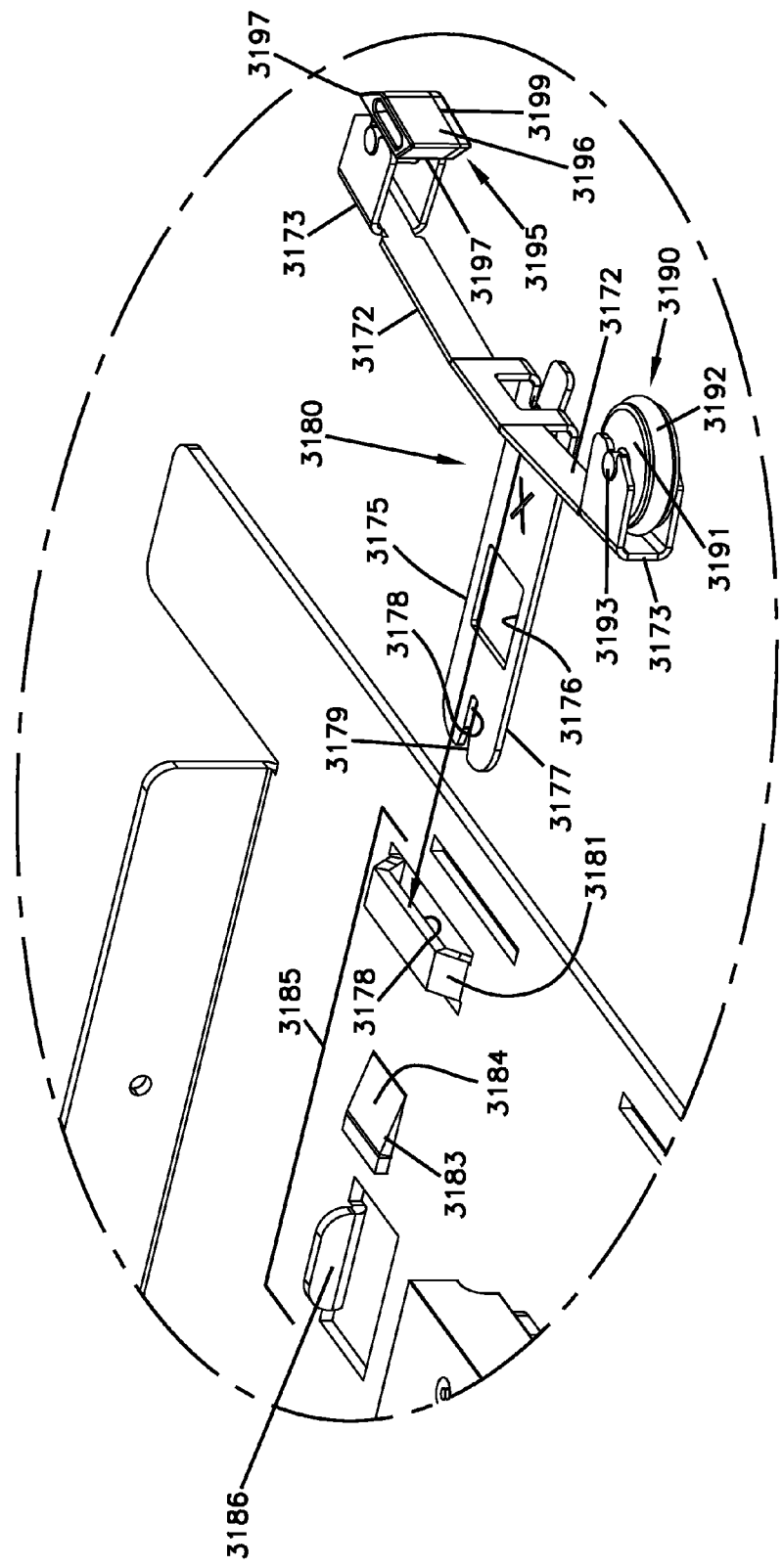
FIG. 17 is an enlarged view of one of the latching arrangements shown in FIG. 16.

FIGS. 14-16 illustrate a fourth example blade 3100 that is suitable for use with a chassis (e.g., chassis 1010 of FIGS. 7-9) in a panel system in a communications equipment rack. In general, each blade 3100 is substantially similar to the blade 2100 shown in FIGS. 10-13 except for the latching arrangement. Accordingly, each blade 3100 includes a generally planar base 3110, a handle 3108 to facilitate positioning of the blade 3100 relative to the chassis 1010, and a coupler arrangement 3150 held by a frame 3115.

Each blade 3100 includes a latching arrangement 3170 that is configured to secure the blade 3100 to the chassis 1010 in one of a plurality of positions. As noted with the blade 2100 of FIGS. 10-13, some types of blades 3100 may move between a closed position and a first extended position. In the closed position, the blade 3100 is positioned within the chassis 1010 so that the front ports of the blade 3100 are located at the open front of the chassis 1010. In the first extended position, at least the front ports of the blade 3100 are located forwardly of the open front of the chassis 1010. In certain implementations, the blades 3100 also may move to a second extended position.

In the second extended position, the front ports of the blade 3100 are located farther forward of the front chassis opening compared to their location in the first extended position.

In some implementations, each blade 3100 includes two latching arrangements 3170. For example, the blade 3100 includes a first latching arrangement 3170A at a first side of the base 3110 and a second latching arrangement 3170B at a second side of the base 3110. In other implementations, the blade 3100 may include a greater or lesser number of latching arrangements 3170. Each latching arrangement 3170 includes at least one stop member 3171 that is configured to fit in one or more latching recesses 1009 defined in the chassis housing 1010 (e.g., see FIGS. 7-9). In the example shown in FIG. 14, each latching arrangement 3170 includes two stop members 3171. In other implementations, however, each latching arrangement 3170 may include a greater or lesser number of stop members 3171.

As described above, at least one sidewall 1011 of the chassis housing 1010 defines one or more latching recesses or openings 1009. The recesses or openings 1009 are sized and shaped to receive the latching stop members 3171 of the latching arrangement 3170. In some implementations, the stop members 3171 of each latching arrangement 3170 are identical to each other. In other implementations, however, the latch arrangement 3170 can include a first type of latch member 3190 and a second type of latch member 3195. In the example shown in FIGS. 14-17, the first type of latch member 3190 is substantially similar to the wheeled latch member 2171 described above with reference to FIGS. 10-13. The first type of latch member 3190 includes a wheel 3191 having an axle 3193 rotatably coupled to the yoke 3173. In certain implementations, an O-ring or gasket 3192 may be disposed over the wheel 3191.

In accordance with some aspects of the disclosure, the second type of latch member 3195 is configured to inhibit removal of the blade 3100 from the chassis 1010. In some implementations, a body 3199 of the second type of latch member 3195 is attached to a pivot hinge 3198 that couples to the yoke 3173 to enable some pivotal movement of the latch member 3195. In other implementations, the body 3199 is fixedly coupled to the yoke 3173. The body 3199 is sized and shaped to fit within the chassis openings 1009. The body 3199 defines a first surface 3196 facing outwardly from the yoke 3173 and extending between side edges 3197. In an example, the first surface 3196 is flat. The side edges 3197 are inclined relative to the first surface 3196 at non-perpendicular angles (see FIG. 15). In an example, the side edges 3197 angle forwardly towards the first surface 3196 to inhibit forward movement of the body 3199 out of a chassis opening 1009 and to facilitate rearward movement of the body 3199 out of the chassis opening 1009.

Each stop member 3171 is coupled to an attachment frame 3180 that couples to the blade 3100. The attachment frame 3180 includes two flexible arms 3172 extending outwardly from an intermediate portion 3174. The yokes 3173 couple to distal ends of the arms 3172. In certain implementations, the flexible arms 3172 flexibly couple to the intermediate portion 3174 (e.g., via a spring-biased section). In the example shown, a distal end of a first flexible arm 3172 extends generally rearwardly of the intermediate portion 3174 and a distal end of a second flexible arm 3172 extends generally forwardly of the intermediate portion 3174 (see FIG. 17). The distal ends of the flexible arms 3172 also are oriented to extend towards one of the sidewalls 1011 of the chassis housing when the blade 3100 is mounted to the chassis. The flexible arms 3172 of the attachment frame 380 are sized so that the space between the stop members 3171 is about equal to the space between adjacent latching recesses or openings 1009 in the chassis 1000 (see FIGS. 7-9).

In some implementations, the flexible arms 3172 are resiliently biased into the recesses or openings 1009 defined in the sidewall 1011. For example, in certain implementations the flexible arms 3172 may include spring arms. Accordingly, the stop members 3171 friction fit into the recesses or openings 1009 as the stop members 3171 are slid or rolled past the recesses or openings 1009 (i.e., when the blade 3100 is moved relative to the chassis 1010). The flexible arms 3172 allow the stop members 3171 to be retracted from the recess or opening 1009 through application of a tangential force (i.e., forward or rearward movement of the blade 3100 relative to the chassis) that overcomes the biasing force. In general, the biasing force applied by the flexible arms 3172 is sufficiently strong as to alert a user that a predetermined position of the blade 1100 relative to the chassis 1010 has been reached. For example, the biasing force is sufficiently strong that a user must noticeably increase the amount of force applied to the blade 3100 to move the blade 3100 relative to the chassis 1010. However, the biasing force is sufficiently weak as to allow the user to overcome the biasing force through a tangential application of force instead of a direct application of force to the stop members 3171 or latching arms 3172.

The attachment frame 3180 also includes a mounting flange 3175 that extends outwardly from the intermediate portion 3174 away from the arms 3172. In an example, the mounting flange 3175 has a major surface that extends generally orthogonal to a major surface of the arms 3172. In an example, the mounting flange 3175 is configured to slide flat against the base 3110 of the blade 3100. The mounting flange 3175 defines an aperture 3176 and a tail 3177. In an example, the aperture 3176 extends through major surfaces of the flange 3175. The tail 3177 defines a slit 3178 that extends towards the aperture 3176. In an example, the slit 3178 terminates before reaching the aperture 3176. In an example, the slit 3178 is oriented to extend between the chassis sidewalls 1011 when the latching arrangement 3170 is attached to the blade 3100 and the blade 3100 is mounted to the chassis 1010.

In accordance with some aspects, each latching arrangement 3170 also includes a mounting arrangement 3185 on the blade 3100 to which the attachment frame 3180 is secured to appropriately position the stop members 3171 on the blade 3100. The mounting arrangement 3185 includes a securement flange 3181 that extends upwardly from the blade base 3110 to define a passage 3182. The securement flange 3181 is sized to accommodate the mounting flange 3175 of the attachment frame 3180 within the passage 3182. For example, the mounting flange 3175 may be slid through the passage 3182. When the attachment frame 3180 is mounted, the securement flange 3181 extends over the mounting flange 3175 and, thereby, inhibits the removal of the latching arrangement 3170 from the blade 3100 in an upward direction. In certain implementations, the intermediate portion 3174 of the attachment frame 3180 limits the distance the mounting flange 3175 may extend through the passage 3182 by abutting the securement flange 3181. Accordingly, the securement flange 3181 also inhibits the removal of the latching arrangement 3170 from the blade 3100 in a first lateral direction.

In some implementations, the mounting arrangement 3185 also includes a latching member 3183 that defines a ramp 3184 and a shoulder (FIG. 16). The mounting flange 3175 is configured to cam over the ramp 3184 and snap over the latching member 3183 so that the latching member 3183 extends through the aperture 3176. The aperture 3176 is sized to receive a sufficient portion of the latching member 3183 to enable an inner edge of the mounting flange 3175 to abut the shoulder of the latching member 3183. The interaction of the mounting flange 3175 and the latching member 3183 inhibits the removal of the mounting flange 3175 from the blade base 3110 in a second lateral direction that is opposite the first lateral direction. The latching connection between the attachment frame 3180 and the mounting arrangement 3185 allows the latching arrangement 3170 to be mounted without tools (e.g., screw driver, riveter, sonic welder, etc.) or fasteners (e.g., screws, rivets, etc.).

In some implementations, the mounting arrangement 3185 also includes a flange 3186 that is sized and oriented to extend through the slit 3178 in the mounting flange 3175 when the mounting flange 3175 is coupled to the mounting arrangement 3185. The flange 3186 inhibits rotational (torqued) movement of the attachment frame 3180 when the attachment frame 3180 is coupled to the mounting arrangement 3185 and/or when the stop members 3171 are moving into and/or out of engagement with the chassis openings 1009.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A bladed panel system comprising:
  a chassis including sidewalls extending between a front and a rear to define an interior, the chassis including guides positioned on the sidewalls, the guides extending in a forward-rearward direction, the sidewalls defining a plurality of latching openings;
  a plurality of blades mounted to the guides of the chassis, each blade including a plurality of front couplers configured to optically couple together media segments, and each blade being configured to move in the forward-rearward direction along a respective one of the guides relative to the chassis between at least a closed position and a first extended position, each blade also defining a mounting arrangement; and
  a latching arrangement on each blade that is configured to releasably lock the blade in the first extended position, the latching arrangement including a plurality of stop members configured to latch in the latching openings in a first of the sidewalls of the chassis, the latching arrangement also including a mounting flange that is configured to latch the latching arrangement to the mounting arrangement of the respective blade without tools or fasteners.

2. The bladed panel system of claim 1, wherein the mounting flange forms part of an attachment frame of the latching arrangement, the attachment frame also including flexible arms extending from an intermediate portion coupled to the mounting flange, each flexible arm being coupled to one of the stop members of the latching arrangement, each flexible arm being biased outwardly away from the mounting flange.

3. The bladed panel system of claim 2, wherein at least one of the stop members includes a wheel.

4. The bladed panel system of claim 2, wherein one of the stop members defines a flat surface edged by two angled surfaces.

5. The bladed panel system of claim 2, wherein at least one of the stop members defines a frustro-conical shape.

6. The bladed panel system of claim 2, wherein the mounting arrangement of each blade includes a latching member, and wherein the mounting flange of each latching arrangement defines an aperture that is sized to accommodate the latching member of the respective blade.

7. The bladed panel system of claim 6, wherein a distal end of the mounting flange defines a slit extending towards the aperture, the slit being configured to mate with a flange extending upwardly from the blade.

8. The bladed panel system of claim 6, wherein the latching member defines a ramp and a shoulder and wherein an inner edge of the mounting flange that bounds the aperture abuts against the shoulder of the latching member when the mounting flange is latched to the latching member.

9. The bladed panel system of claim 2, wherein each blade also includes a securement flange that extends upwardly from a base of the blade to define a passage that is sized to accommodate the mounting flange of the respective latching arrangement.

10. The bladed panel system of claim 1, wherein the latching arrangement is a first latching arrangement, wherein each blade also includes a second latching arrangement at an opposite side of the blade from the first latching arrangement, and wherein each latching arrangement includes two stop members.

11. The bladed panel system of claim 1, wherein each of the chassis sidewalls defines three latching openings per blade.

12. A blade comprising:
  a base having a front, a rear, a first side, and a second side;
  a plurality of front ports located at the front of the base;
  a handle coupled to the base, the handle extending forwardly of the front ports from a center point at the front of the base;
  a plurality of latching arrangements each including an intermediate portion, a mounting flange extending from the intermediate portion, a first flexible arm extending from the intermediate portion, and a second flexible arm extending from the intermediate portion, the mounting flange of each latching arrangement being held stationary relative to the base, each flexible arm of each latching arrangement being spring-biased outwardly from the intermediate portion, a distal end of each flexible arm including a stop member, the first flexible arm of each latching arrangement extending towards the rear of the base relative to the intermediate portion and the second flexible arm of each latching arrangement extending towards the front of the base relative to the intermediate portion.

13. The blade of claim 12, wherein at least one of the stop members of each latching arrangement includes a wheel.

14. The blade of claim 12, wherein at least one of the stop members of each latching arrangement defines a flat surface edged by two angled surfaces.

15. The blade of claim 12, wherein at least one of the stop members of each latching arrangement defines a frustro-conical shape.

16. The blade of claim 12, wherein the intermediate portion, the mounting flange, the first flexible arm, and the second flexible arm of each latching arrangement are monolithically formed.

17. The blade of claim 12, wherein the mounting flange defines an aperture therethrough.

18. The blade of claim 17, wherein the mounting flange defines a slit extending towards the aperture.

19. A method of releasably locking a plurality of blades in predefined positions relative to a chassis, each blade including a base, a handle extending from the base, a first latching arrangement, and a second latching arrangement, each latching arrangement including a forward flexible arm and a rearward flexible arm, each flexible arm having a distal end at which a stop member is disposed, the method comprising:
  gripping the handle of a first blade;

pulling the handle of the first blade to move the first blade forwardly relative to the chassis, the handle being stationary relative to the first blade, wherein pulling the first blade forwardly does not move any other blades, and wherein pulling the first blade forwardly causes the stop members of the rearward flexible arms of the latching arrangements to retract out of rear recesses defined in the chassis and causes the stop members of the forward flexible arms of the latching arrangements to retract out of intermediate recesses defined in the chassis without additional user intervention; and continuing to pull the handle until the first blade is at a first extended position relative to the chassis at which the stop members of the rearward flexible arms of the latching arrangements snap automatically into the intermediate recesses defined in the chassis and the stop members of the forward flexible arms of the latching arrangements snap automatically into forward recesses defined in the chassis.

20. The method of claim 19, further comprising:

pulling the handle to move the first blade to a second extended position in which the first blade is moved farther forwardly of the chassis, wherein pulling the handle causes the stop members of the rearward flexible arms of the latching arrangements to retract out of the intermediate recesses defined in the chassis and causes the stop members of the forward flexible arms of the latching arrangements to retract out of the forward recesses defined in the chassis without additional user intervention; and continuing to pull the handle until the first blade is at the second extended position relative to the chassis.

21. The method of claim 19, further comprising:

pushing the handle of the first blade to move the first blade rearwardly relative to the chassis from the first extended position to the closed position, wherein pushing the first blade rearwardly does not move any other blades, and wherein pushing the first blade rearwardly causes the stop members of the rearward flexible arms of the latching arrangements to retract out of the intermediate recesses defined in the chassis and causes the stop members of the forward flexible arms of the latching arrangements to retract out of the forward recesses defined in the chassis without additional user intervention; and continuing to push the handle until the first blade is at the closed position relative to the chassis at which the stop members of the rearward flexible arms of the latching arrangements snap automatically into the rear recesses defined in the chassis and the stop members of the forward flexible arms of the latching arrangements snap automatically into the intermediate recesses defined in the chassis.

22. The method of claim 20, wherein the stop members of the rearward flexible arms of the latching arrangements snap automatically into the forward recesses defined in the chassis when the first blade is at the second extended position and the forward flexible arms of the latching arrangements extend through an open front of the chassis when the first blade is at the second extended position.

* * * * *